US010411496B2

(12) United States Patent
Zhang et al.

(10) Patent No.: US 10,411,496 B2
(45) Date of Patent: Sep. 10, 2019

(54) CHARGING SYSTEM AND CHARGING METHOD, AND POWER ADAPTER

(71) Applicant: GUANGDONG OPPO MOBILE TELECOMMUNICATIONS CORP., LTD., Dongguan (CN)

(72) Inventors: Jialiang Zhang, Dongguan (CN); Shebiao Chen, Dongguan (CN); Jun Zhang, Dongguan (CN); Chen Tian, Dongguan (CN); Shiming Wan, Dongguan (CN); Jiada Li, Dongguan (CN)

(73) Assignee: GUANGDONG OPPO MOBILE TELECOMMUNICATIONS CORP., LTD., Dongguan, Guangdong (CN)

( * ) Notice: Subject to any disclaimer, the term of this patent is extended or adjusted under 35 U.S.C. 154(b) by 56 days.

(21) Appl. No.: 15/669,347

(22) Filed: Aug. 4, 2017

(65) Prior Publication Data
US 2017/0338670 A1 Nov. 23, 2017

Related U.S. Application Data

(63) Continuation of application No. PCT/CN2016/091758, filed on Jul. 26, 2016, which is
(Continued)

(51) Int. Cl.
*H02J 7/00* (2006.01)
*H02J 7/04* (2006.01)
(Continued)

(52) U.S. Cl.
CPC ............ *H02J 7/045* (2013.01); *H01F 27/425* (2013.01); *H01M 10/0525* (2013.01);
(Continued)

(58) Field of Classification Search
CPC .... H02M 3/33523; H02M 1/08; H02J 7/0072; H02J 7/022; H02J 7/04
(Continued)

(56) References Cited

U.S. PATENT DOCUMENTS

| 4,087,733 A | 5/1978 | Casagrande |
| 6,025,695 A | 2/2000 | Friel et al. |

(Continued)

FOREIGN PATENT DOCUMENTS

| CN | 1564421 A | 1/2005 |
| CN | 101106283 A | 1/2008 |

(Continued)

OTHER PUBLICATIONS

EPO, Office Action for EP Application No. 16889010, dated Apr. 24, 2018.
(Continued)

*Primary Examiner* — Zixuan Zhou
(74) *Attorney, Agent, or Firm* — Hodgson Russ LLP

(57) ABSTRACT

The present disclosure discloses a charging system and a charging method and a power adapter. The system includes a battery, a first rectifier, a switch unit, a transformer, a second rectifier, a sampling unit and a control unit. The control unit outputs a control signal to the switch unit, and adjusts a duty ratio of the control signal according to a current sampling value and/or a voltage sampling value sampled by the sampling unit, such that a third voltage with a third ripple waveform outputted by the second rectifier meets a charging requirement. The third voltage is configured to be introduced into the battery.

20 Claims, 10 Drawing Sheets

Related U.S. Application Data a continuation of application No. PCT/CN2016/073679, filed on Feb. 5, 2016.

(51) Int. Cl.

| | | |
|---|---|---|
| *H04M 19/00* | (2006.01) | |
| *H02J 7/02* | (2016.01) | |
| *H02M 3/335* | (2006.01) | |
| *H02M 1/08* | (2006.01) | |
| *H02J 7/06* | (2006.01) | |
| *H02J 7/14* | (2006.01) | |
| *H02J 7/24* | (2006.01) | |
| *H02M 1/00* | (2006.01) | |
| *H02M 3/156* | (2006.01) | |
| *H02M 7/06* | (2006.01) | |
| *H01F 27/42* | (2006.01) | |
| *H01M 10/0525* | (2010.01) | |
| *H02M 5/458* | (2006.01) | |
| *H01F 27/40* | (2006.01) | |

(52) U.S. Cl.
CPC ............ *H02J 7/0004* (2013.01); *H02J 7/007* (2013.01); *H02J 7/008* (2013.01); *H02J 7/0009* (2013.01); *H02J 7/0027* (2013.01); *H02J 7/0029* (2013.01); *H02J 7/0042* (2013.01); *H02J 7/0044* (2013.01); *H02J 7/0045* (2013.01); *H02J 7/0052* (2013.01); *H02J 7/0072* (2013.01); *H02J 7/0091* (2013.01); *H02J 7/0093* (2013.01); *H02J 7/02* (2013.01); *H02J 7/022* (2013.01); *H02J 7/04* (2013.01); *H02J 7/041* (2013.01); *H02J 7/042* (2013.01); *H02J 7/047* (2013.01); *H02J 7/06* (2013.01); *H02J 7/1492* (2013.01); *H02J 7/245* (2013.01); *H02M 1/00* (2013.01); *H02M 1/08* (2013.01); *H02M 3/156* (2013.01); *H02M 3/33507* (2013.01); *H02M 3/33515* (2013.01); *H02M 3/33523* (2013.01); *H02M 3/33546* (2013.01); *H02M 3/33569* (2013.01); *H02M 7/06* (2013.01); *H04M 19/00* (2013.01); *H01F 2027/408* (2013.01); *H02J 2007/0049* (2013.01); *H02J 2007/0059* (2013.01); *H02J 2007/0095* (2013.01); *H02J 2007/0096* (2013.01); *H02J 2007/0098* (2013.01); *H02M 5/458* (2013.01); *H02M 2001/0009* (2013.01); *H02M 2001/0048* (2013.01); *Y02D 70/20* (2018.01); *Y02D 70/26* (2018.01)

(58) Field of Classification Search
USPC ................ 320/164, 128, 134, 136, 145, 159
See application file for complete search history.

(56) References Cited

U.S. PATENT DOCUMENTS

| | | | |
|---|---|---|---|
| 6,137,265 A | 10/2000 | Cummings et al. | |
| 6,909,617 B1 | 6/2005 | Mirskiy | |
| 2004/0090209 A1 | 5/2004 | Nishida et al. | |
| 2006/0284595 A1 | 12/2006 | Hsieh et al. | |
| 2008/0197811 A1 | 8/2008 | Hartular et al. | |
| 2012/0262950 A1* | 10/2012 | Nate | H02J 9/005 363/16 |
| 2013/0141034 A1 | 6/2013 | Huang et al. | |
| 2015/0180356 A1* | 6/2015 | Norisada | H02M 3/33546 363/17 |

FOREIGN PATENT DOCUMENTS

| | | |
|---|---|---|
| CN | 202026118 | 11/2011 |
| CN | 102545360 | 7/2012 |
| CN | 102364856 | 10/2013 |
| CN | 103762702 | 4/2014 |
| CN | 103795040 | 5/2014 |
| CN | 104810877 | 7/2015 |
| CN | 104810879 | 7/2015 |
| CN | 104917271 | 9/2015 |
| CN | 104967199 | 10/2015 |
| CN | 104967201 | 10/2015 |
| CN | 105098900 A | 11/2015 |
| CN | 106026327 | 10/2016 |
| EP | 2228884 | 9/2010 |
| EP | 2887492 | 6/2015 |
| EP | 2930589 | 10/2015 |
| EP | 2980958 | 2/2016 |
| JP | 2008136278 | 6/2008 |
| JP | 2012075313 | 4/2012 |
| JP | 2013198262 | 9/2013 |
| JP | 5454781 | 3/2014 |
| JP | 5617545 B2 | 11/2014 |
| JP | 5822304 | 11/2015 |
| TW | 200616305 | 5/2006 |
| TW | M481439 | 7/2014 |
| TW | 201444224 | 11/2014 |
| TW | 201535930 | 9/2015 |
| TW | 201624904 | 7/2016 |
| WO | 2012167677 | 12/2012 |
| WO | 2015113341 | 8/2015 |
| WO | 2015113349 | 8/2015 |

OTHER PUBLICATIONS

JPO, Office Action for JP Application No. 2017557146, dated Apr. 24, 2018.
Chen, "A Design of an Optimal Battery Pulse Charge System by Frequency-Varied Technique", IEEE Transactions on Industrial Electronics, vol. 54, No. 1, Feb. 2007, pp. 398-405.
KIPO, Office Action for KR Application No. 20177002310, dated Jun. 26, 2018.
KIPO, Office Action for KR Application No. 20177002310, dated Jan. 29, 2018.
IPOS, Office Action for SG Application No. 11201700428U, dated Nov. 23, 2017.
APO, Office Action for AU Application No. 2016291545, dated Jun. 25, 2018.
EPO, Office Action for EP Application No. 16819788, dated Nov. 15, 2017.
WIPO, English Translation of the ISR/WO for CN Application No. PCT/CN2016/073679, dated Nov. 10, 2016.
JPO, Office Action for JP Application No. 2017557146, dated Aug. 14, 2018.
EPO, Office Action for EP Application No. 16889010, dated Dec. 7, 2018.

\* cited by examiner

CHARGING SYSTEM AND CHARGING METHOD, AND POWER ADAPTER

CROSS-REFERENCE TO RELATED APPLICATIONS

This application is a continuation application of an International Application No. PCT/CN2016/091758, filed on Jul. 26, 2016, which is based upon and claims priority to International Application No. PCT/CN2016/073679, filed on Feb. 5, 2016, the entire contents of which are incorporated herein by reference.

TECHNICAL FIELD

The present disclosure generally relates to a terminal technical field, and more particularly, to a charging system, a charging method, and a power adapter.

BACKGROUND

Nowadays, mobile terminals such as smart phones are favored by more and more consumers. However, the mobile terminal consumes large power energy, and needs to be charged frequently.

Typically, the mobile terminal is charged by a power adapter. The power adapter generally includes a primary rectifier circuit, a primary filter circuit, a transformer, a secondary rectifier circuit, a secondary filter circuit and a control circuit, such that the power adapter converts the input alternating current of 220V into a stable and low voltage direct current (for example, 5V) suitable for requirements of the mobile terminal, and provides the direct current to a power management device and a battery of the mobile terminal, thereby realizing charging the mobile terminal.

However, with the increasing of the power of the power adapter, for example, from 5 W to larger power such as 10 W, 15 W, 25 W, it needs more electronic elements capable of bearing large power and realizing better control for adaptation, which not only increases a size of the power adapter, but also increases a production cost and manufacture difficulty of the power adapter.

SUMMARY

Embodiments of a first aspect of the present disclosure provide a charging system. The charging system includes a battery, a first rectifier, configured to rectify an input alternating current and output a first voltage with a first ripple waveform; a switch unit, configured to modulate the first voltage according to a control signal and output a modulated first voltage; a transformer, configured to output a second voltage with a second ripple waveform according to the modulated first voltage; a second rectifier, configured to rectify the second voltage to output a third voltage with a third ripple waveform; a sampling unit, configured to sample current outputted by the second rectifier to obtain a current sampling value; and a control unit, coupled to the sampling unit and the switch unit respectively, and configured to output the control signal to the switch unit, and to control a charging process to be in a constant current charging stage by adjusting a duty ratio of the control signal when it is determined that current outputted is high or low according to the current sampling value. The third voltage is applied to the battery.

Embodiments of a second aspect of the present disclosure provide a power adapter. The power adapter includes: a first rectifier, configured to rectify an input alternating current and output a first voltage with a first ripple waveform; a switch unit, configured to modulate the first voltage according to a control signal and output a modulated first voltage; a transformer, configured to output a second voltage with a second ripple waveform according to the modulated first voltage; a second rectifier, configured to rectify the second voltage to output a third voltage with a third ripple waveform, in which the third voltage is configured to be introduced into a terminal to charge a battery in the terminal when the power adapter is coupled to the terminal; a sampling unit, configured to sample current outputted by the second rectifier to obtain a current sampling value; and a control unit, coupled to the sampling unit and the switch unit respectively, and configured to output the control signal to the switch unit, and to control a charging process performed by the power adapter on a terminal to be in a constant current charging stage by adjusting a duty ratio of the control signal when it is determined that current outputted by the power adapter is high or low according to the current sampling value.

Embodiments of a third aspect of the present disclosure provide a charging method. The charging method includes: when a power adapter is coupled to a terminal, performing a first rectification on a first alternating current to output a first voltage with a first ripple waveform; modulating the first voltage by controlling a switch unit, and outputting a second voltage with a second ripple waveform by a conversion of a transformer; performing a second rectification on the second voltage to output a third voltage with a third ripple waveform, and applying the third voltage to a battery of the terminal; sampling current after the second rectification to obtain a current sampling value; controlling a charging process performed by the power adapter on the terminal to be in a constant current charging stage by adjusting a duty ratio of a control signal for controlling the switch unit when it is determined that current outputted by the power adapter is high or low according to the current sampling value.

DETAILED DESCRIPTION

Figure 1A:
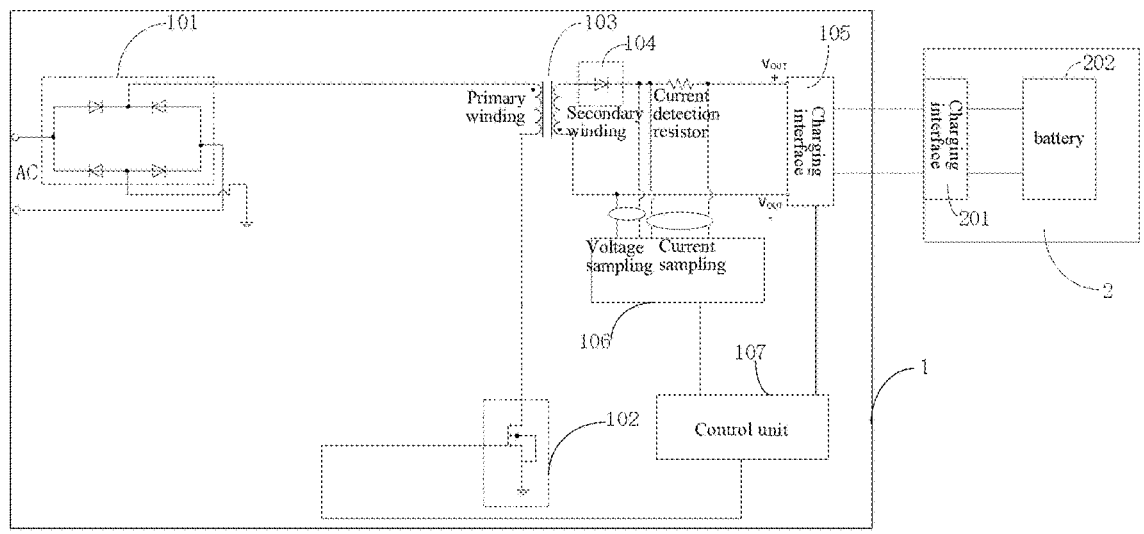
FIG. 1A is a schematic diagram illustrating a charging system using a flyback switching power supply according to an embodiment of the present disclosure.

Descriptions will be made in detail to embodiments of the present disclosure, examples of which are illustrated in drawings, in which the same or similar elements and the elements having same or similar functions are denoted by like reference numerals throughout the descriptions. The embodiments described herein with reference to drawings are explanatory, are intended to understand the present disclosure, and are not construed to limit the present disclosure.

The present disclosure is made based on following understanding and researches.

The inventors find that, during a charging to a battery of a mobile terminal by a power adapter, with the increasing of power of the power adapter, it is easy to cause an increase in polarization resistance of the battery and temperature of the battery, thus reducing a service life of the battery, and affecting a reliability and a safety of the battery.

Moreover, most devices cannot work directly with alternating current when the power is usually supplied with the alternating current, because the alternating current such as mains supply of 220V and 50 Hz outputs electric energy discontinuously. In order to avoid the discontinuity, it needs to use an electrolytic condenser to store the electric energy, such that when the power supply is in the trough period, it is possible to depend on the electric energy stored in the electrolytic condenser to ensure a continue and stable power supply. Thus, when an alternating current power source charges the mobile terminal via the power adapter, the alternating current such as the alternating current of 220V provided by the alternating current power source is converted into stable direct current, and the stable direct current is provided to the mobile terminal. However, the power adapter charges the battery in the mobile terminal so as to supply power to the mobile terminal indirectly, and the continuity of power supply can be guaranteed by the battery, such that it is unnecessary for the power adapter to output stable and continue direct current when charging the battery.

Accordingly, a first objective of the present disclosure is to provide a charging system, which enables a voltage with a ripple waveform outputted by a power adapter to be applied to a battery of the terminal directly, thus realizing a miniaturization and low cost of the power adapter, and prolonging a service life of the battery.

A second objective of the present disclosure is to provide a power adapter. A third objective of the present disclosure is to provide a charging method.

In the following, a charging system, a power adapter and a charging method provided in embodiments of the present disclosure will be described with reference to drawings.

Referring to FIGS. 1A-14, the charging system may include a battery 202, a first rectifier 101, a switch unit 102, a transformer 103, a second rectifier 104, a sampling unit 106, and a control unit 107.

The first rectifier 101 is configured to rectify an input alternating current and output a first voltage with a first ripple waveform. The switch unit 102 is configured to modulate the first voltage according to a control signal and output a modulated first voltage. The transformer 103 is configured to output a second voltage with a second ripple waveform according to the modulated first voltage. The second rectifier 104 is configured to rectify the second voltage to output a third voltage with a third ripple waveform. The sampling unit 106 is configured to sample current outputted by the second rectifier to obtain a current sampling value. The control unit 107 is coupled to the sampling unit 106 and the switch unit 102 respectively. The control unit 107 is configured to output the control signal to the switch unit 102, and to control a charging process to be in a constant current charging stage by adjusting a duty ratio of the control signal when it is determined that current outputted is high or low according to the current sampling value. The third voltage is applied to the battery 202.

In at least one embodiment of the present disclosure, part or all structure (hardware and software) of the adapter can be integrated into the terminal Integrated structure of the adapter and the terminal can be called as the charging system of the present disclosure, or called as a terminal.

In an embodiment of the present disclosure, the charging system provided in embodiments of the present disclosure includes a power adapter 1 and a terminal 2. The battery may be a component in a terminal 2. The first rectifier, the switch unit, the transformer, the second rectifier, the sampling unit and the control unit may be disposed in a power adapter 1.

Figure 2:
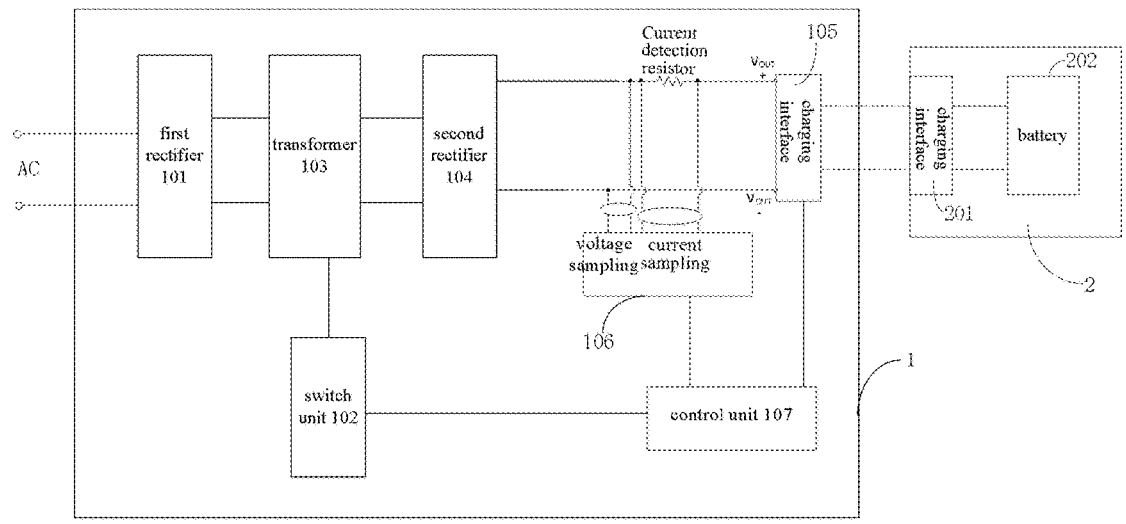
FIG. 2 is a block diagram of a charging system according to embodiments of the present disclosure.

As illustrated in FIG. 2, the power adapter 1 includes the first rectifier 101, the switch unit 102, the transformer 103, the second rectifier 104, the sampling unit 106 and the control unit 107. The first rectifier 101 is configured to rectify an input alternating current (mains supply, for example AC 220V) to output a first voltage with a first ripple waveform, for example a voltage with a steamed bun waveform. As illustrated in FIG. 1A, the first rectifier 101 may be a full-bridge rectifier circuit formed of four diodes. The switch unit 102 is configured to modulate the first voltage with the first ripple waveform according to a control signal to output a modulated first voltage. The switch unit 102 may be formed of MOS transistors. A PWM (Pulse Width Modulation) control is performed on the MOS transistors to perform a chopping modulation on the voltage with the steamed bun waveform. The transformer 103 is configured to output a second voltage with a second ripple waveform according to the modulated first voltage. The second rectifier 104 is configured to rectify the second voltage to output a third voltage with a third ripple waveform, in which the third voltage is configured to be introduced into a terminal to charge a battery in the terminal when the power adapter is coupled to the terminal. The second rectifier 104 may be formed of diodes or MOS transistors, and can realize a secondary synchronous rectification, such that the third ripple waveform keeps synchronous with a waveform of the modulated first voltage. It should be noted that, the third ripple waveform keeping synchronous with the waveform of the modulated first voltage means that, a phase of the third ripple waveform is consistent with that of the waveform of the modulated first voltage, and a variation trend of magnitude of the third ripple waveform is consistent with that of the waveform of the modulated first voltage. The sampling unit 106 is configured to sample current outputted by the second rectifier 104 to obtain a current sampling value. The control unit 107 is coupled to the sampling unit 106 and the switch unit 102 respectively, and configured to output the control signal to the switch unit 102, and to control a charging process performed by the power adapter 1 to the terminal 2 to be in a constant current charging stage by adjusting a duty ratio of the control signal when it is determined that current outputted by the power adapter is high or low according to the current sampling value.

It should be noted that, when the current outputted by the power adapter 1 is high or low, a peak current/a mean current of the third ripple waveform outputted by the second rectifier 104 is higher or lower than a current reference value of the constant current charging stage, i.e. higher or lower than the current reference value of the constant current charging stage by a certain preset value.

Further, in an embodiment of the present disclosure, the power adapter further includes a first charging interface 105. The first charging interface 105 is coupled to the second rectifier 104. The first charging interface 105 is configured to apply the third voltage to the battery in the terminal via a second charging interface of the terminal when the first charging interface 105 is coupled to the second charging interface, in which the second charging interface is coupled to the battery.

As illustrated in FIG. 2, the terminal 2 includes a battery 202. The third voltage is configured to be introduced into a terminal to charge a battery in the terminal when the power adapter is coupled to the terminal.

In an embodiment, the terminal 2 further includes a second charging interface 201. The second charging interface 201 is coupled to the battery 202. When the second charging interface 201 is coupled to the first charging interface 105, the second charging interface 201 is configured to apply the third voltage with the third ripple waveform to the battery 202, so as to charge the battery 202.

In an embodiment of the present disclosure, the control unit 107 is configured to reduce the duty ratio of the control signal when the current outputted by the power adapter 1 is high, such that the current outputted by the power adapter 1 is reduced to the current reference value. The control unit 107 is configured to increase the duty ratio of the control signal when the current outputted by the power adapter 1 is low, such that the current outputted by the power adapter 1 is increased to the current reference value.

In an embodiment of the present disclosure, the sampling unit 106 is further configured to sample voltage outputted by the second rectifier 106 to obtain a voltage sampling value.

After the constant current charging stage is completed, the control unit 107 is further configured to control the charging process performed by the power adapter 1 to the terminal 2 to be in a constant voltage charging stage by adjusting the duty ratio of the control signal when it is determined that voltage outputted by the power adapter is high or low according to the voltage sampling value.

In an embodiment, when the voltage outputted by the power adapter 1 is high or low, a peak voltage/a mean voltage of the third ripple waveform outputted by the second rectifier 104 is higher or lower than a voltage reference value of the constant voltage charging stage, i.e. higher or lower than the voltage reference value of the constant voltage charging stage by a certain preset value.

The control unit 107 is configured to reduce the duty ratio of the control signal when the voltage outputted by the power adapter 1 is high, such that the voltage outputted by the power adapter 1 is reduced to the voltage reference value. The control unit 107 is configured to increase the duty ratio of the control signal when the voltage outputted by the power adapter is low, such that the voltage outputted by the power adapter 1 is increased to the voltage reference value.

In an embodiment of the present disclosure, as illustrated in FIG. 1A, the power adapter 1 may employ a flyback switching power supply. In detail, the transformer 103 includes a primary winding and a secondary winding. An end of the primary winding is coupled to a first output end of the first rectifier 101. A second output end of the first rectifier 101 is grounded. Another end of the primary winding is coupled to the switch unit 102 (for example, if the switch unit 102 is a MOS transistor, the other end of the primary winding is coupled to a drain of the MOS transistor). The transformer 103 is configured to output a second voltage with a second ripple waveform according to the modulated first voltage.

The transformer 103 is a high-frequency transformer of which a working frequency ranges from 50 KHz to 2 MHz. The high-frequency transformer is configured to couple the modulated first voltage to the secondary side so as to output via the secondary winding. In embodiments of the present disclosure, with the high-frequency transformer, a characteristic of a small size compared to the low-frequency transformer (also known as an industrial frequency transformer, mainly used in the frequency of mains supply such as alternating current of 50 Hz or 60 Hz) may be exploited to realize miniaturization of the power adapter 1.

Figure 1B:
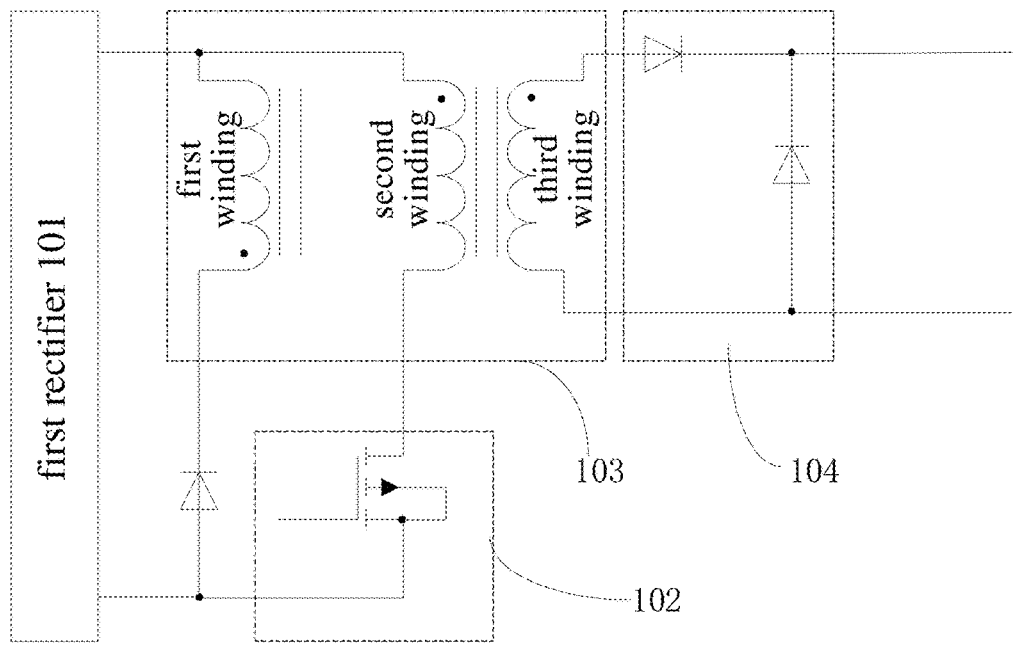
FIG. 1B is a schematic diagram illustrating a charging system using a forward switching power supply according to an embodiment of the present disclosure.

In an embodiment of the present disclosure, as illustrated in FIG. 1B, the power adapter 1 may also adopt a forward switching power supply. In detail, the transformer 103 includes a first winding, a second winding and a third winding. A dotted terminal of the first winding is coupled to a second output end of the first rectifier 101 via a backward diode. A non-dotted terminal of the first winding is coupled to a dotted terminal of the second winding and then coupled to a first output end of the first rectifier 101. A non-dotted terminal of the second winding is coupled to the switch unit 102. The third winding is coupled to the second rectifier 104. The backward diode is configured to realize reverse peak clipping. An induced potential generated by the first winding may perform amplitude limiting on a reverse potential via the backward diode and return limited energy to an output of the first rectifier 101, so as to charge the output of the first rectifier 101. Moreover, a magnetic field generated by current flowing through the first winding may demagnetize a core of the transformer, so as to return magnetic field intensity in the core of the transformer to an initial state. The transformer 103 is configured to output the second voltage with the second ripple waveform according to the modulated first voltage.

Figure 1C:
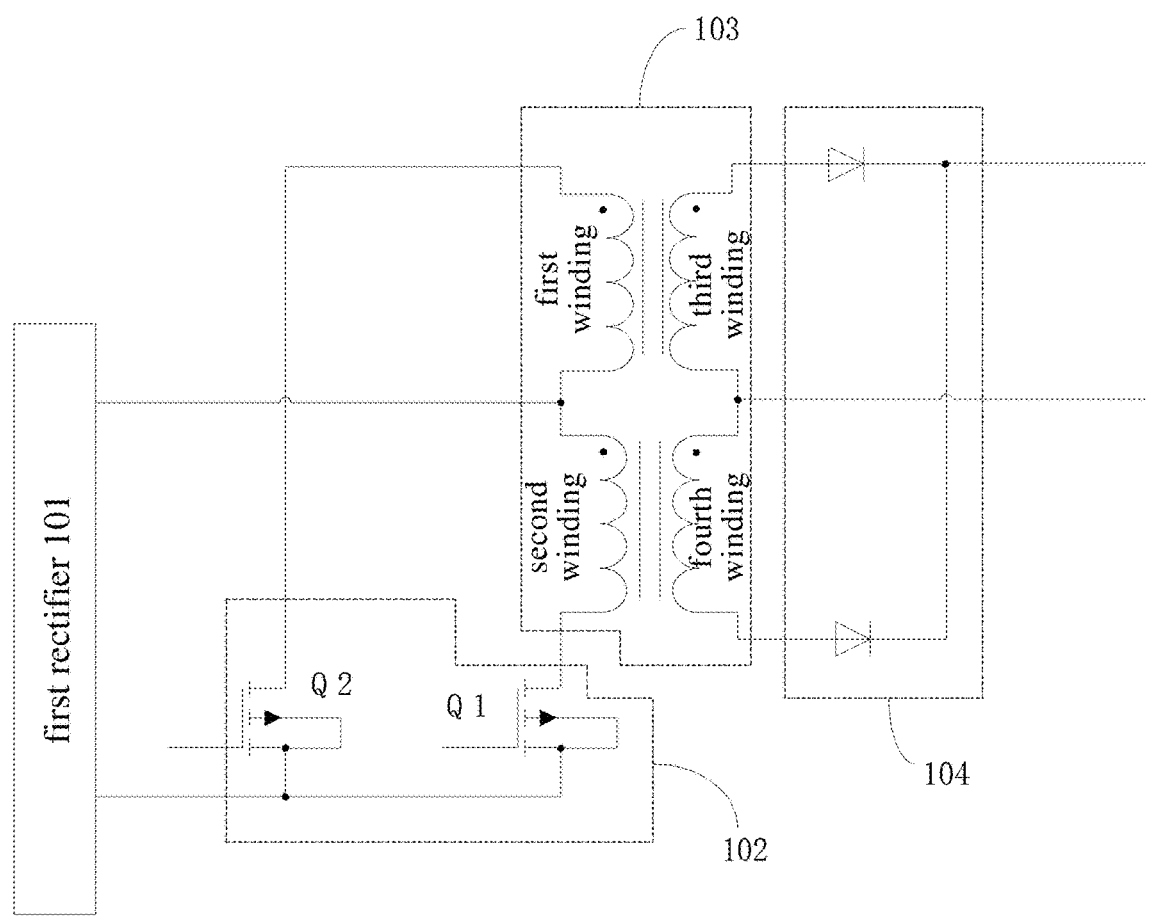
FIG. 1C is a schematic diagram illustrating a charging system using a push-pull switching power supply according to an embodiment of the present disclosure.

According to an embodiment of the present disclosure, as illustrated in FIG. 1C, the above-mentioned power adapter 1 may adopt a push-pull switching power supply. In detail, the transformer includes a first winding, a second winding, a third winding and a fourth winding. A dotted terminal of the first winding is coupled to the switch unit 102. A non-dotted terminal of the first winding is coupled to a dotted terminal of the second winding and then coupled to the first output end of the first rectifier 101. A non-dotted terminal of the second winding is coupled to the switch unit 102. A non-dotted terminal of the third winding is coupled to a dotted terminal of the fourth winding. The transformer is configured to output the second voltage with the second ripple waveform according to the modulated first voltage.

As illustrated in FIG. 1C, the switch unit 102 includes a first MOS transistor Q1 and a second MOS transistor Q2. The transformer 103 includes a first winding, a second winding, a third winding and a fourth winding. A dotted terminal of the first winding is coupled to a drain of the first MOS transistor Q1 in the switch unit 102. A non-dotted terminal of the first winding is coupled to a dotted terminal of the second winding. A node between the non-dotted terminal of the first winding and the dotted terminal of the second winding is coupled to the first output end of the first rectifier 101. A non-dotted terminal of the second winding is coupled to a drain of the second MOS transistor Q2 in the switch unit 102. A source of the first MOS transistor Q1 is coupled to a source of the second MOS transistor Q2 and then coupled to the second output end of the first rectifier 101. A dotted terminal of the third winding is coupled to a first input end of the second rectifier 104. A non-dotted terminal of the third winding is coupled to a dotted terminal of the fourth winding. A node between the non-dotted terminal of the third winding and the dotted terminal of the fourth winding is grounded. A non-dotted terminal of the fourth winding is coupled to a second input end of the second rectifier 104.

As illustrated in FIG. 1C, the first input end of the second rectifier 104 is coupled to the dotted terminal of the third winding, and the second input end of the second rectifier 104 is coupled to the non-dotted terminal of the fourth winding. The second rectifier 104 is configured to rectify the second voltage with the second ripple waveform and to output the third voltage with the third ripple waveform. The second rectifier 104 may include two diodes. An anode of one diode is coupled to the dotted terminal of the third winding. An anode of another diode is coupled to a non-dotted terminal of the fourth winding. A cathode of one diode is coupled to that of the other diode.

Figure 1D:
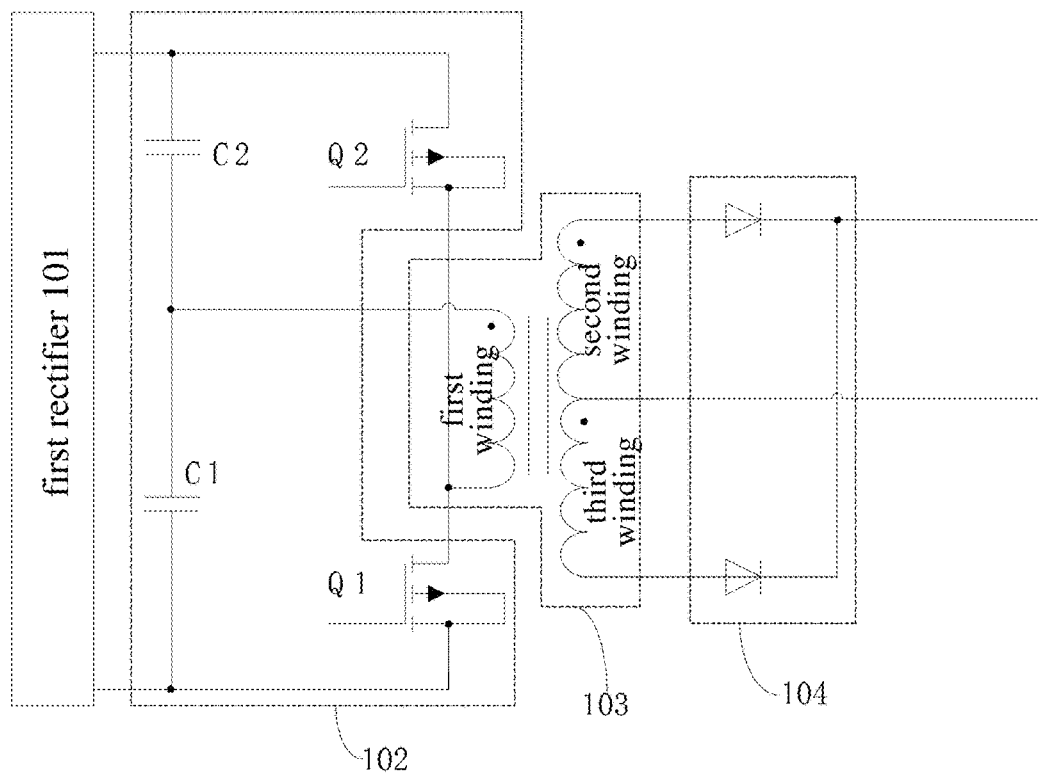
FIG. 1D is a schematic diagram illustrating a charging system using a half-bridge switching power supply according to an embodiment of the present disclosure.

According to an embodiment of the present disclosure, as illustrated in FIG. 1D, the above-mentioned power adapter 1 may also adopt a half-bridge switching power supply. In detail, the switch unit 102 includes a first MOS transistor Q1, a second MOS transistor Q2, a first capacitor C1 and a second capacitor C2. The first capacitor C1 and the second capacitor C2 are coupled in series, and then coupled in parallel to the output ends of the first rectifier 101. The first MOS transistor Q1 and the second MOS transistor Q2 are coupled in series, and then coupled in parallel to the output ends of the first rectifier 101. The transformer 103 includes a first winding, a second winding and a third winding. A dotted terminal of the first winding is coupled to a node between the first capacitor C1 and the second capacitor C2 coupled in series. A non-dotted terminal of the first winding is coupled to a node between the first MOS transistor Q1 and the second MOS transistor Q2 coupled in series. A dotted terminal of the second winding is coupled to the first input end of the second rectifier 104. A non-dotted terminal of the second winding is coupled to a dotted terminal of the third winding, and then grounded. A non-dotted terminal of the third winding is coupled to the second input end of the second rectifier 104. The transformer 103 is configured to output the second voltage with the second ripple waveform according to the modulated first voltage.

Figure 1E:
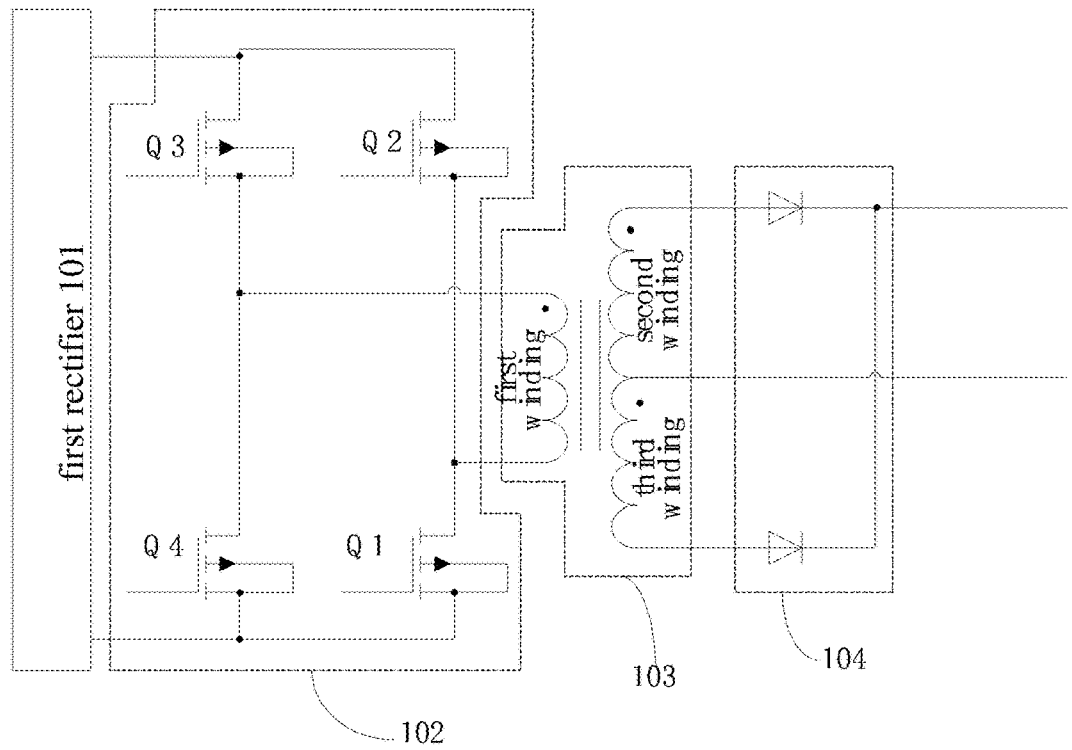
FIG. 1E is a schematic diagram illustrating a charging system using a full-bridge switching power supply according to an embodiment of the present disclosure.

According to an embodiment of the present disclosure, as illustrated in FIG. 1E, the above-mentioned power adapter 1 may also adopt a full-bridge switching power supply. In detail, the switch unit 102 includes a first MOS transistor Q1, a second MOS transistor Q2, a third MOS transistor Q3 and a fourth MOS transistor Q4. The third MOS transistor Q3 and the fourth MOS transistor Q4 are coupled in series and then coupled in parallel to the output ends of the first rectifier 101. The first MOS transistor Q1 and the second MOS transistor Q2 are coupled in series and then coupled in parallel to the output ends of the first rectifier 101. The transformer 103 includes a first winding, a second winding and a third winding. A dotted terminal of the first winding is coupled to a node between the third MOS transistor Q3 and the fourth MOS transistor Q4 coupled in series. A non-dotted terminal of the first winding is coupled to a node between the first MOS transistor Q1 and the second MOS transistor Q2 coupled in series. A dotted terminal of the second winding is coupled to the first input end of the second rectifier 104. A non-dotted terminal of the second winding is coupled to a dotted terminal of the third winding, and then grounded. A non-dotted terminal of the third winding is coupled to the second input end of the second rectifier 104. The transformer 103 is configured to output the second voltage with the second ripple waveform according to the modulated first voltage.

Therefore, in embodiments of the present disclosure, the above-mentioned power adapter 1 may adopt any one of the flyback switching power supply, the forward switching power supply, the push-pull switching power supply, the half-bridge switching power supply and the full-bridge switching power supply to output the voltage with the ripple waveform.

Further, as illustrated in FIG. 1A, the second rectifier 104 is coupled to the secondary winding of the transformer 103. The second rectifier 104 is configured to rectify the second voltage to output the third voltage with the third ripple waveform. The second rectifier 104 may be formed of diodes, and can realize a secondary synchronous rectification, such that the third ripple waveform keeps synchronous with a waveform of the modulated first voltage. It should be noted that, the third ripple waveform keeping synchronous with the waveform of the modulated first voltage means that, a phase of the third ripple waveform is consistent with that of the waveform of the modulated first voltage, and a variation trend of magnitude of the third ripple waveform is consistent with that of the waveform of the modulated first voltage. The first charging interface 105 is coupled to the second rectifier 104. The sampling unit 106 is configured to sample current and/or voltage outputted by the second rectifier 104 to obtain a current sampling value and/or a voltage sampling value. The control unit 107 is coupled to the sampling unit 106 and the switch unit 102 respectively, and configured to output the control signal to the switch unit 102, and to adjust the duty ratio of the control signal according to the current sampling value and/or the voltage sampling value, such that the third voltage outputted by the second rectifier 104 meets the charging requirement.

As illustrated in FIG. 1A, the terminal 2 includes a second charging interface 201 and a battery 202. The second charging interface 201 is coupled to the battery 202. When the second charging interface 201 is coupled to the first charging interface 105, the second charging interface 201 is configured to apply the third voltage with the third ripple waveform to the battery 202, so as to charge the battery 202.

Figure 3:
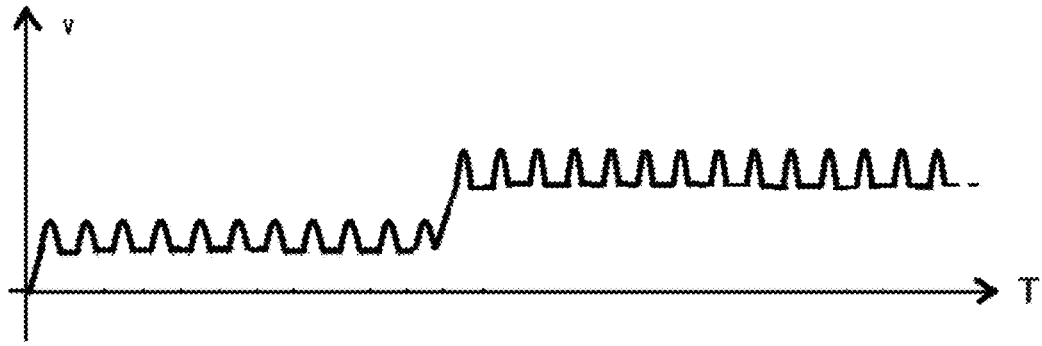
FIG. 3 is a schematic diagram illustrating a waveform of a charging voltage outputted to a battery from a power adapter according to an embodiment of the present disclosure.
Figure 4:
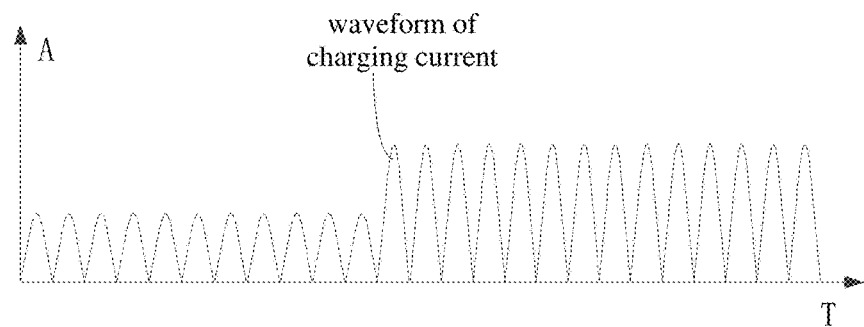
FIG. 4 is a schematic diagram illustrating a waveform of a charging current outputted to a battery from a power adapter according to an embodiment of the present disclosure.

In an embodiment, the third voltage with the third ripple waveform meeting the charging requirement means that, the third voltage and current with the third ripple waveform need to meet the charging voltage and charging current when the battery is charged. In other words, the control unit 107 is configured to adjust the duty ratio of the control signal (such as a PWM signal) according to the sampled voltage and/or current outputted by the power adapter, so as to adjust the output of the second rectifier 104 in real time and realize a closed-loop adjusting control, such that the third voltage with the third ripple waveform meets the charging requirement of the terminal 2, thus ensuring the stable and safe charging of the battery 202. In detail, a waveform of a charging voltage outputted to a battery 202 is illustrated in FIG. 3, in which the waveform of the charging voltage is adjusted according to the duty ratio of the PWM signal. A waveform of a charging current outputted to a battery 202 is illustrated in FIG. 4, in which the waveform of the charging current is adjusted according to the duty ratio of the PWM signal.

In an embodiment, when adjusting the duty ratio of the PWM signal, an adjusting instruction may be generated according to the voltage sampling value, or according to the current sampling value, or according to the voltage sampling value and the current sampling value.

Therefore, in embodiments of the present disclosure, by controlling the switch unit 102, a PWM chopping modulation is directly performed on the first voltage with the first ripple waveform i.e. the steamed bun waveform after a rectification, and then a modulated voltage is sent to the high-frequency transformer and is coupled from the primary side to the secondary side via the high-frequency transformer, and then is changed back to the voltage/current with the steamed bun waveform after a synchronous rectification. The voltage/current with the steamed bun waveform is directly transmitted to the battery so as to realize fast charging (which is described as the second charging in the following) to the battery. The magnitude of the voltage with the steamed bun waveform may be adjusted according to the duty ratio of the PWM signal, such that the output of the power adapter may meet the charging requirement of the battery. It can be seen from that, the power adapter according to embodiments of the present disclosure, without providing electrolytic condensers at the primary side and the secondary side, may directly charge the battery via the voltage with the steamed bun waveform, such that a size of the power adapter may be reduced, thus realizing miniaturization of the power adapter, and decreasing cost greatly.

In an embodiment of the present disclosure, the control unit 107 may be an MCU (micro controller unit), which means that the control unit 107 may be a micro processor integrated with a switch driving control function, a synchronous rectification function, a voltage and current adjusting control function.

According to an embodiment of the present disclosure, the control unit 107 is further configured to adjust a frequency of the control signal according to the voltage sampling value and/or the current sampling value. That is, the control unit 107 is further configured to control to output the PWM signal to the switch unit 102 for a continuous time period, and then to stop outputting for a predetermined time period and then to restart to output the PWM signal. In this way, the voltage applied to the battery is intermittent, thus realizing the intermittent charging of the battery, which avoids a safety hazard caused by heating phenomenon occurring when the battery is charged continuously and improves the reliability and safety of the charging to the battery.

Under a low temperature condition, since the conductivity of ions and electrons in a lithium battery decreases, it is prone to intensify degree of polarization during a charging process for the lithium battery. A continuous charging not only makes this polarization serious but also increases a possibility of lithium precipitation, thus affecting safety performance of the battery. Furthermore, the continuous charging may accumulate heat generated due to the charging, thus leading to an increasing of internal temperature of the battery. When the temperature exceeds a certain value, performance of the battery may be limited, and possibility of safety hazard is increased.

In embodiments of the present disclosure, by adjusting the frequency of the control signal, the power adapter outputs intermittently, which means that a battery resting process is introduced into the charging process, such that the lithium precipitation due to the polarization during the continuous charging is reduced and continuous accumulation of generated heat may be avoided to realize drop in the temperature, thus ensuring the safety and reliability of charging to the battery.

Figure 5:
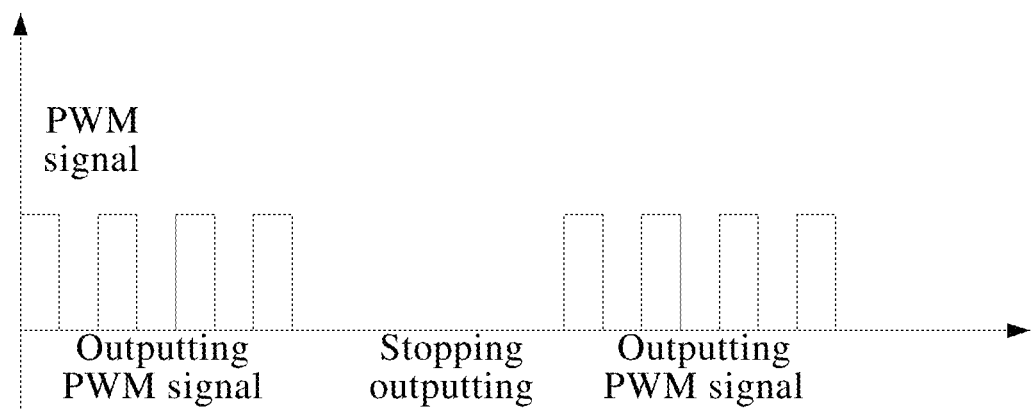
FIG. 5 is a schematic diagram illustrating a control signal outputted to a switch unit according to an embodiment of the present disclosure.

The control signal outputted to the switch unit 102 is illustrated in FIG. 5, for example. Firstly, the PWM signal is outputted for a continuous time period, then output of the PWM signal is stopped for a certain time period, and then the PWM signal is outputted for a continuous time period again. In this way, the control signal output to the switch unit 102 is intermittent, and the frequency is adjustable.

As illustrated in FIG. 1A, the control unit 107 is coupled to the first charging interface 105. The control unit 107 is further configured to obtain status information of the terminal 2 by performing a communication with the terminal 2 via the first charging interface 105. In this way, the control unit 107 is further configured to adjust the duty ratio of the control signal (such as the PWM signal) according to the status information of the terminal, the voltage sampling value and/or the current sampling value.

The status information of the terminal includes an electric quantity of the battery, a temperature of the battery, a voltage of the battery, interface information of the terminal and information on a path impedance of the terminal.

In detail, the first charging interface 105 includes a power wire and a data wire. The power wire is configured to charge the battery. The data wire is configured to communicate with the terminal. When the second charging interface 201 is coupled to the first charging interface 105, communication query instructions may be transmitted by the power adapter 1 and the terminal 2 to each other. A communication connection can be established between the power adapter 1 and the terminal 2 after receiving a corresponding reply instruction. The control unit 107 may obtain the status information of the terminal 2, so as to negotiated with the terminal 2 about a charging mode and charging parameters (such as the charging current, the charging voltage) and to control the charging process.

The charging mode supported by the power adapter and/or the terminal may include a first charging mode and a second charging mode. A charging speed of the second charging mode is faster than that of the first charging mode. For example, a charging current of the second charging mode is greater than that of the first charging mode. In general, the first charging mode may be understood as a charging mode in which a rated output voltage is 5V and a rated output current is less than or equal to 2.5 A. In addition, in the first charging mode, D+ and D− in the data wire of an output port of the power adapter may be short-circuited. On the contrary, in the second charging mode according to embodiments of the present disclosure, the power adapter may realize data exchange by communicating with the terminal via D+ and D− in the data wire, i.e., second charging instructions may be sent by the power adapter and the terminal to each other. The power adapter sends a second charging query instruction to the terminal. After receiving a second charging reply instruction from the terminal, the power adapter obtains the status information of the terminal and operates in the second charging mode according to the second charging reply instruction. The charging current in the second charging mode may be greater than 2.5 A, for example, may be 4.5 A or more. The first charging mode is not limited in embodiments of the present disclosure. As long as the power adapter supports two charging modes one of which has a charging speed (or current) greater than the other charging mode, the charging mode with a slower charging speed may be regarded as the first charging mode. As to the charging power, the charging power in the second charging mode may be greater than or equal to 15 W.

The first charging mode is a normal charging mode and the second charging mode is a fast charging mode. Under the normal charging mode, the power adapter outputs a relatively small current (typically less than 2.5 A) or charges the battery in the mobile terminal with a relatively small power (typically less than 15 W). While, under the fast charge mode, the power adapter outputs a relatively large current (typically greater than 2.5 A, such as 4.5 A, 5 A or higher) or charges the battery in the mobile terminal with a relatively large power (typically greater than or equal to 15 W), compared to the normal charging mode. In the normal charging mode, it may take several hours to fully fill a larger capacity battery (such as a battery with 3000 mAh), while in the fast charging mode, the period of time may be significantly shortened when the larger capacity battery is fully filled, and the charging is faster.

The control unit 107 communicates with the terminal 2 via the first charging interface 105 to determine the charging mode. The charging mode includes the second charging mode and the first charging mode.

In detail, the power adapter is coupled to the terminal via a universal serial bus (USB) interface. The USB interface may be a general USB interface, or a micro USB interface. A data wire in the USB interface is configured as the data wire in the first charging interface, and configured for a bidirectional communication between the power adapter and the terminal. The data wire may be D+ and/or D− wire in the USB interface. The bidirectional communication may refer to an information interaction performed between the power adapter and the terminal.

The power adapter performs the bidirectional communication with the terminal via the data wire in the USB interface, so as to determine to charge the terminal in the second charging mode.

In an embodiment, during a process that the power adapter and the terminal negotiate whether to charge the terminal in the second charging mode, the power adapter may only keep a coupling with the terminal but does not charge the terminal, or charges the terminal in the first charging mode or charges the terminal with small current, which is not limited herein.

The power adapter adjusts a charging current to a charging current corresponding to the second charging mode, and charges the terminal. After determining to charge the terminal in the second charging mode, the power adapter may directly adjust the charging current to the charging current corresponding to the second charging mode or may negotiate with the terminal about the charging current of the second charging mode. For example, the charging current corresponding to the second charging mode may be determined according to a current electric quantity of the battery of the terminal.

In embodiments of the present disclosure, the power adapter does not increase the output current blindly for second charging, but needs to perform the bidirectional communication with the terminal so as to negotiate whether to adopt the second charging mode. In contrast to the related art, the safety of second charging is improved.

As an embodiment, when the control unit 107 performs the bidirectional communication with the terminal via the first charging interface so as to determine to charge the terminal in the second charging mode, the control unit 107 is configured to send a first instruction to the terminal and to receive a first reply instruction from the terminal. The first instruction is configured to query the terminal whether to operate in the second charging mode. The first reply instruction is configured to indicate that the terminal agrees to operate in the second charging mode.

As an embodiment, before the control unit sends the first instruction to the terminal, the power adapter is configured to charge the terminal in the first charging mode. The control unit is configured to send the first instruction to the terminal when determining that a charging duration of the first charging mode is greater than a predetermined threshold.

In an embodiment, when the power adapter determines that the charging duration of the first charging mode is greater than the predetermined threshold, the power adapter may determine that the terminal has identified it as a power adapter, such that the second charging query communication may start.

As an embodiment, after determining the terminal is charged for a predetermined time period with a charging current greater than or equal to a predetermined current threshold, the power adapter is configured to send the first instruction to the terminal.

As an embodiment, the control unit is further configured to control the power adapter to adjust a charging current to a charging current corresponding to the second charging mode by controlling the switch unit. Before the power adapter charges the terminal with the charging current corresponding to the second charging mode, the control unit is configured to perform the bidirectional communication with the terminal via the data wire of the first charging interface to determine a charging voltage corresponding to the second charging mode, and to control the power adapter to adjust a charging voltage to the charging voltage corresponding to the second charging mode.

As an embodiment, when the control unit performs the bidirectional communication with the terminal via the data wire of the first charging interface to determine the charging voltage corresponding to the second charging mode, the control unit is configured to send a second instruction to the terminal, to receive a second reply instruction sent from the terminal, and to determine the charging voltage corresponding to the second charging mode according to the second reply instruction. The second instruction is configured to query whether a current output voltage of the power adapter is suitable for being used as the charging voltage corresponding to the second charging mode. The second reply instruction is configured to indicate that the current output voltage of the power adapter is suitable, high or low.

As an embodiment, before controlling the power adapter to adjust the charging current to the charging current corresponding to the second charging mode, the control unit is further configured to perform the bidirectional communication with the terminal via the data wire of the first charging interface to determine the charging current corresponding to the second charging mode.

As an embodiment, when performing the bidirectional communication with the terminal via the data wire of the first charging interface to determine the charging current corresponding to the second charging mode, the control unit is configured to send a third instruction to the terminal, to receive a third reply instruction sent from the terminal and to determine the charging current corresponding to the second charging mode according to the third reply instruction. The third terminal is configured to query a maximum charging current supported by the terminal. The third reply instruction is configured to indicate the maximum charging current supported by the terminal.

The power adapter may determine the above maximum charging current as the charging current corresponding to the second charging mode, or may set the charging current as a charging current less than the maximum charging current.

As an embodiment, during a process that the power adapter charges the terminal in the second charging mode, the control unit is further configured to perform the bidirectional communication with the terminal via the data wire of the first charging interface, so as to continuously adjust a charging current outputted to the battery from the power adapter by controlling the switch unit.

The power adapter may query the status information of the terminal continuously, for example, query the voltage of the battery of the terminal, the electric quantity of the battery, etc, so as to adjust continuously the charging current outputted by the power adapter to the battery.

As an embodiment, when the control unit performs the bidirectional communication with the terminal via the data wire of the first charging interface to continuously adjust the charging current outputted to the battery from the power adapter by controlling the switch unit, the control unit is configured to send a fourth instruction to the terminal, to receive a fourth reply instruction sent by the terminal, and to adjust the charging current outputted by the power adapter to the battery by controlling the switch unit according to the current voltage of the battery. The fourth instruction is configured to query a current voltage of the battery in the terminal. The fourth reply instruction is configured to indicate the current voltage outputted by the power adapter to the battery in the terminal.

As an embodiment, the control unit is configured to adjust the charging current outputted to the battery from the power adapter to a charging current value corresponding to the current voltage of the battery by controlling the switch unit according to the current voltage of the battery and a predetermined correspondence between battery voltage values and charging current values.

In detail, the power adapter may store the correspondence between battery voltage values and charging current values in advance. The power adapter may also perform the bidirectional communication with the terminal via the data wire of the first charging interface to obtain from the terminal the correspondence between battery voltage values and charging current values stored in the terminal.

As an embodiment, during the process that the power adapter charges the terminal in the second charging mode, the control unit is further configured to determine whether there is a poor contact between the first charging interface and the second charging interface by performing the bidirectional communication with the terminal via the data wire of the first charging interface. When determining that there is the poor contact between the first charging interface and the second charging interface, the control unit is configured to control the power adapter to quit the second charging mode.

As an embodiment, before determining whether there is the poor contact between the first charging interface and the second charging interface, the control unit is further configured to receive information indicating a path impedance of the terminal from the terminal. The control unit is configured to send a fourth instruction to the terminal. The fourth instruction is configured to query a current voltage of the battery in the terminal. The control unit is configured to receive a fourth reply instruction sent by the terminal. The fourth reply instruction is configured to indicate the current voltage of the battery in the terminal. The control unit is configured to determine a path impedance from the power adapter to the battery according to an output voltage of the power adapter and the current voltage of the battery and determines whether there is the poor contact between the first charging interface and the second charging interface according to the path impedance from the power adapter to the battery, the path impedance of the terminal, and a path impedance of a charging wire between the power adapter and the terminal.

The terminal may record the path impedance thereof in advance. For example, since the terminals in a same type have a same structure, the path impedance of the terminals in the same type is set to a same value when configuring factory settings. Similarly, the power adapter may record the path impedance of the charging wire in advance. When the power adapter obtains the voltage cross two ends of the battery of the terminal, the path impedance of the whole path can be determined according to the voltage drop cross two ends of the battery and current of the path. When the path impedance of the whole path>the path impedance of the terminal+the path impedance of the charging wire, or the path impedance of the whole path−(the path impedance of the terminal+the path impedance of the charging wire)>an impedance threshold, it can be considered that there is the poor contact between the first charging interface and the second charging interface.

As an embodiment, before the power adapter quits the second charging mode, the control unit is further configured to send a fifth instruction to the terminal. The fifth instruction is configured to indicate that there is the poor contact between the first charging interface and the second charging interface.

After sending the fifth instruction, the power adapter may quit the second charging mode or reset.

The second charging process according to embodiments of the present disclosure is described from the perspective of the power adapter, and then the second charging process according to embodiments of the present disclosure will be described from the perspective of the terminal in the following.

In an embodiment, the interaction between the power adapter and the terminal, relative characteristics, functions described at the terminal side correspond to descriptions at the power adapter side, thus repetitive description will be omitted for simplification.

Figure 13:
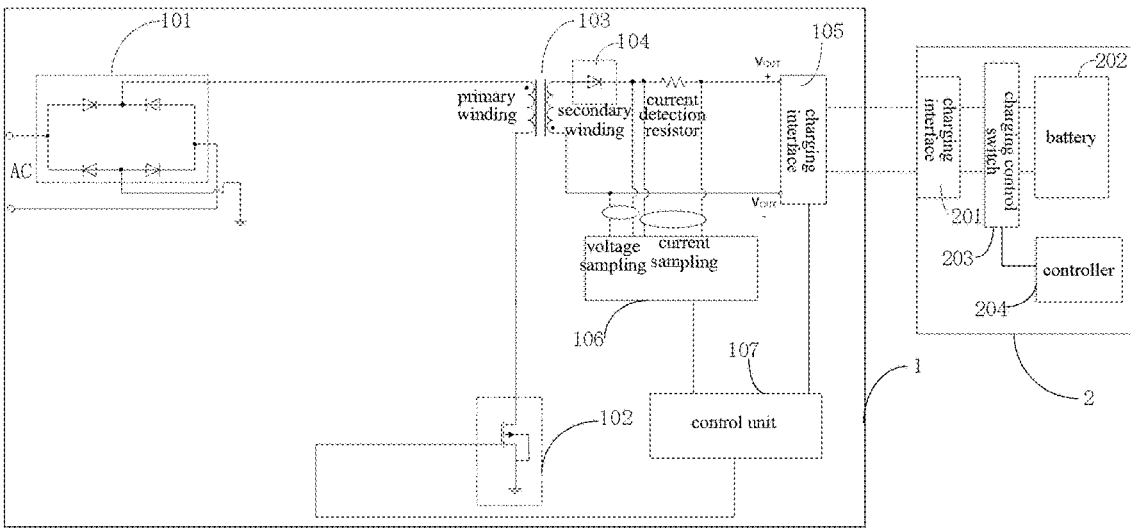
FIG. 13 is a schematic diagram illustrating a terminal according to an embodiment of the present disclosure.

According to an embodiment of the present disclosure, as illustrated in FIG. 13, the terminal 2 further includes a charging control switch 203 and a controller 204. The charging control switch 203, such as a switch circuit formed of an electronic switch element, is coupled between the second charging interface 201 and the battery 202, and is configured to switch on or off a charging process of the battery 202 under a control of the controller 204. In this way, the charging process of the battery 202 can be controlled at the terminal side, thus ensuring the safety and reliability of charging to battery 202.

Figure 14:
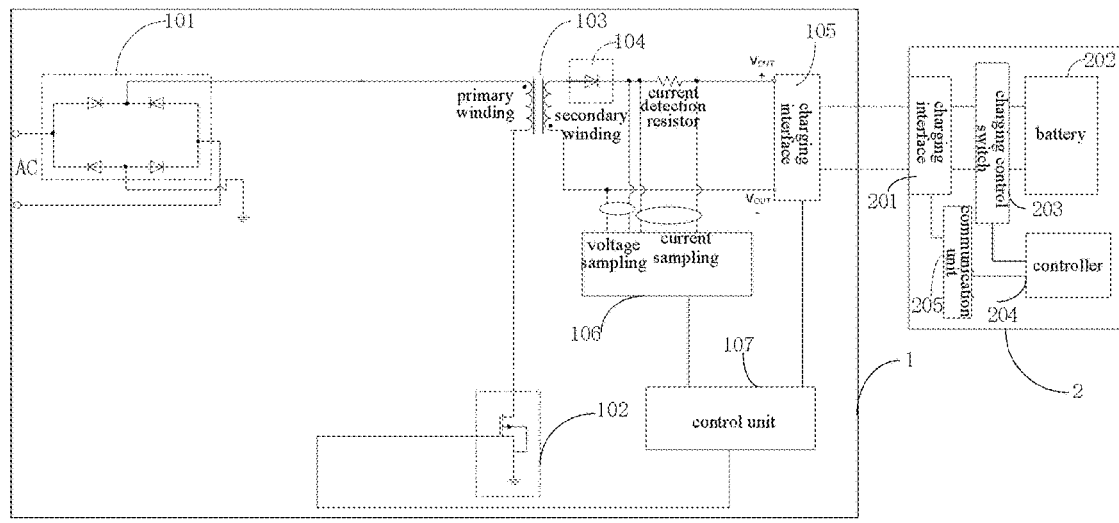
FIG. 14 is a schematic diagram illustrating a terminal according to another embodiment of the present disclosure.

As illustrated in FIG. 14, the terminal 2 further includes a communication unit 205. The communication unit 205 is configured to establish a bidirectional communication between the controller 204 and the control unit 107 via the second charging interface 201 and the first charging interface 105. In other words, the terminal 2 and the power adapter 1 can perform the bidirectional communication via the data wire in the USB interface. The terminal 2 supports the first charging mode and the second charging mode. The charging current of the second charging mode is greater than that of the first charging mode. The communication unit 205 performs the bidirectional communication with the control unit 107 such that the power adapter 1 determines to charge the terminal 2 in the second charging mode, and the control unit 107 controls the power adapter 1 to output according to the charging current corresponding to the second charging mode, for charging the battery 202 in the terminal 2.

In embodiments of the present disclosure, the power adapter 1 does not increase the output current blindly for the second charging, but needs to perform the bidirectional communication with the terminal 2 to negotiate whether to adopt the second charging mode. In contrast to the related art, the safety of the second charging process is improved.

As an embodiment, the controller is configured to receive the first instruction sent by the control unit via the communication unit. The first instruction is configured to query the terminal whether to operate in the second charging mode. The controller is configured to send a first reply instruction to the control unit via the communication unit. The first reply instruction is configured to indicate that the terminal agrees to operate in the second charging mode.

As an embodiment, before the controller receives the first instruction sent by the control unit via the communication unit, the battery in the terminal is charged by the power adapter in the first charging mode. When the control unit determines that a charging duration of the first charging mode is greater than a predetermined threshold, the control unit sends the first instruction to the communication unit in the terminal, and the controller receives the first instruction sent by the control unit via the communication unit.

As an embodiment, before the power adapter outputs according to the charging current corresponding to the second charging mode for charging the battery in the terminal, the controller is configured to perform the bidirectional communication with the control unit via the communication unit, such that the power adapter determines the charging voltage corresponding to the second charging mode.

As an embodiment, the controller is configured to receive a second instruction sent by the control unit, and to send a second reply instruction to the control unit. The second instruction is configured to query whether a current output voltage of the power adapter is suitable for being used as the charging voltage corresponding to the second charging mode. The second reply instruction is configured to indicate that the current output voltage of the power adapter is suitable, high or low.

As an embodiment, the controller is configured to perform the bidirectional communication with the control unit, such that the power adapter determines the charging current corresponding to the second charging mode.

The controller is configured to receive a third instruction sent by the control unit, in which the third instruction is configured to query a maximum charging current supported by the terminal. The controller is configured to send a third reply instruction to the control unit, in which the third reply instruction is configured to indicate the maximum charging current supported by the terminal, such that the power adapter determines the charging current corresponding to the second charging mode according to the maximum charging current.

As an embodiment, during a process that the power adapter charges the terminal in the second charging mode, the controller is configured to perform the bidirectional communication with the control unit, such that the power adapter continuously adjusts a charging current outputted to the battery.

The controller is configured to receive a fourth instruction sent by the control unit, in which the fourth instruction is configured to query a current voltage of the battery in the terminal. The controller is configured to send a fourth reply instruction to the control unit, in which the fourth reply instruction is configured to indicate the current voltage of the battery in the terminal, such that the power adapter continuously adjusts the charging current outputted to the battery according to the current voltage of the battery.

As an embodiment, during the process that the power adapter charges the terminal in the second charging mode, the controller is configured to perform the bidirectional communication with the control unit via the communication unit, such that the power adapter determines whether there is a poor contact between the first charging interface and the second charging interface.

The controller receives a fourth instruction sent by the control unit. The fourth instruction is configured to query a current voltage of the battery in the terminal. The controller sends a fourth reply instruction to the control unit, in which the fourth reply instruction is configured to indicate the current voltage of the battery in the terminal, such that the control unit determines whether there is the poor contact between the first charging interface and the second charging interface according to an output voltage of the power adapter and the current voltage of the battery.

As an embodiment, the controller is configured to receive a fifth instruction sent by the control unit. The fifth instruction is configured to indicate that there is the poor contact between the first charging interface and the second charging interface.

Figure 6:
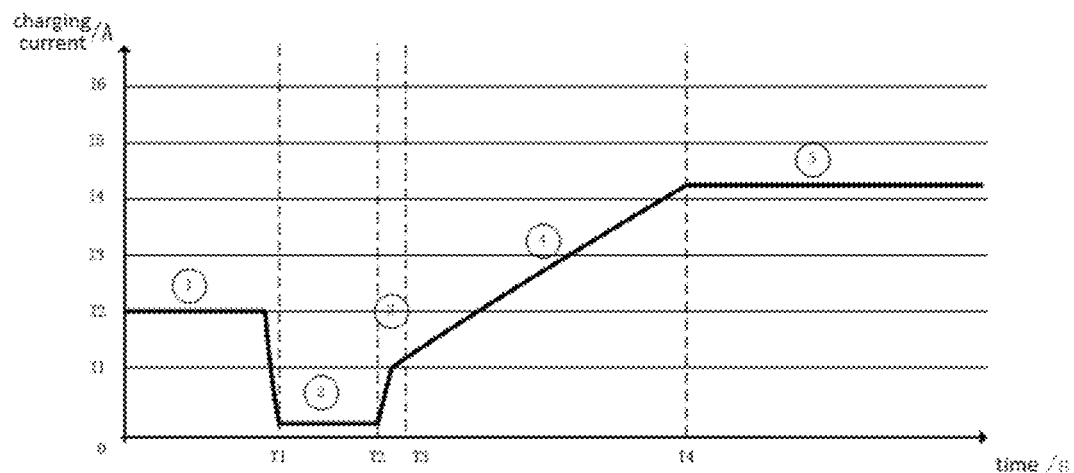
FIG. 6 is a schematic diagram illustrating a second charging process according to an embodiment of the present disclosure.

In order to initiate and adopt the second charging mode, the power adapter may perform a second charging communication procedure with the terminal, for example, by one or more handshakes, so as to realize the second charging of battery. Referring to FIG. 6, the second charging communication procedure according to embodiments of the present disclosure and respective stages in the second charging process will be described in detail. It should be understood that, communication actions or operations illustrated in FIG. 6 are merely exemplary. Other operations or various modifications of respective operations in FIG. 6 can be implemented in embodiments of the present disclosure. In addition, respective stages in FIG. 6 may be executed in an order different from that illustrated in FIG. 6, and it is unnecessary to execute all the operations illustrated in FIG. 6. A curve in FIG. 6 represents a variation trend of a peak value or a mean value of the charging current, rather than a curve of actual charging current.

As illustrated in FIG. 6, the second charging process may include the following five stages.

Stage 1:

After being coupled to a power supply providing device, the terminal may detect a type of the power supply providing device via the data wire D+ and D−. When detecting that the power supply providing device is a power adapter, the terminal may absorb current greater than a predetermined current threshold I2, such as 1 A. When the power adapter detects that current outputted by the power adapter is greater than or equal to I2 within a predetermined time period (such as a continuous time period T1), the power adapter determines that the terminal has completed the recognition of the type of the power supply providing device. The power adapter initiates a handshake communication between the power adapter and the terminal, and sends an instruction 1 (corresponding to the above-mentioned first instruction) to query the terminal whether to operate in the second charging mode (or flash charging).

When receiving a reply instruction indicating that the terminal disagrees to operate in the second charging mode from the terminal, the power adapter detects the output current of the power adapter again. When the output current of the power adapter is still greater than or equal to I2 within a predetermined continuous time period (such as a continuous time period T1), the power adapter initiates a request again to query the terminal whether to operate in the second charging model. The above actions in stage 1 are repeated, until the terminal replies that it agrees to operate in the second charging mode or the output current of the power adapter is no longer greater than or equal to I2.

After the terminal agrees to operate in the second charging mode, the second charging process is initiated, and the second charging communication procedure goes into stage 2.

Stage 2:

For the voltage with the steamed bun waveform outputted by the power adapter, there may be several levels. The power adapter sends an instruction 2 (corresponding to the above-mentioned second instruction) to the terminal to query the terminal whether the output voltage of the power adapter matches to the current voltage of the battery (or whether the output voltage of the power adapter is suitable, i.e., suitable for the charging voltage in the second charging mode), i.e., whether the output voltage of the power adapter meets the charging requirement.

The terminal replies that the output voltage of the power adapter is higher, lower or suitable. When the power adapter receives a feedback indicating that the output voltage of the power adapter is lower or higher from the terminal, the control unit adjusts the output voltage of the power adapter by one level by adjusting the duty ratio of the PWM signal, and sends the instruction 2 to the terminal again to query the terminal whether the output voltage of the power adapter matches.

The above actions in stage 2 are repeated, until the terminal replies to the power adapter that the output voltage of the power adapter is at a matching level. And then the second charging communication procedure goes into stage 3.

Stage 3:

After the power adapter receives the feedback indicating that the output voltage of the power adapter matches from the terminal, the power adapter sends an instruction 3 (corresponding to the above-mentioned third instruction) to the terminal to query the maximum charging current supported by the terminal. The terminal returns to the power adapter the maximum charging current supported by itself, and then the second charging communication procedure goes into stage 4.

Stage 4:

After receiving a feedback indicating the maximum charging current supported by the terminal from the terminal, the power adapter may set an output current reference value. The control unit 107 adjusts the duty ratio of the PWM signal according to the output current reference value, such that the output current of the power adapter meets the charging current requirement of the terminal, and the second charging communication procedure goes into constant current charging stage. The constant current charging stage means that the peak value or mean value of the output current of the power adapter basically remains unchanged (which means that the variation amplitude of the peak value or mean value of the output current is very small, for example within a range of 5% of the peak value or mean value of the output current), namely, the peak value of the current with the third ripple waveform keeps constant in each period.

Stage 5:

When the second charging communication procedure goes into the constant current stage, the power adapter sends an instruction 4 (corresponding to the above-mentioned fourth instruction) at intervals to query the current voltage of battery in the terminal. The terminal may feedback to the power adapter the current voltage of the battery, and the power adapter may determine according to the feedback of the current voltage of the battery whether there is a poor USB contact (i.e., a poor contact between the first charging interface and the second charging interface) and whether it is necessary to decrease the charging current value of the terminal. When the power adapter determines that there is the poor USB contact, the power adapter sends an instruction 5 (corresponding to the above-mentioned fifth instruction), and then the power adapter is reset, such that the second charging communication procedure goes into stage 1 again.

In some embodiments of the present disclosure, in stage 1, when the terminal replies to the instruction 1, data corresponding to the instruction 1 may carry data (or information) on the path impedance of the terminal. The data on the path impedance of the terminal may be used in stage 5 to determine whether there is the poor USB contact.

In some embodiments of the present disclosure, in stage 2, the time period from when the terminal agrees to operate in the second charging mode to when the power adapter adjusts the voltage to a suitable value may be limited in a certain range. If the time period exceeds a predetermined range, the terminal may determine that there is an exception request, thus a quick reset is performed.

In some embodiments of the present disclosure, in stage 2, the terminal may give a feedback indicating that the output voltage of the power adapter is suitable/matches to the power adapter when the output voltage of the power adapter is adjusted to a value higher than the current voltage of the battery by ΔV (ΔV is about 200-500 mV). When the terminal gives a feedback indicating that the output voltage of the power adapter is not suitable (higher or lower) to the power adapter, the control unit 107 adjusts the duty ratio of the PWM signal according to the voltage sampling value, so as to adjust the output voltage of the power adapter.

In some embodiments of the present disclosure, in stage 4, the adjusting speed of the output current value of the power adapter may be controlled to be in a certain range, thus avoiding an abnormal interruption of the second charging due to the too fast adjusting speed.

In some embodiments of the present disclosure, in stage 5, the variation amplitude of the output current value of the power adapter may be controlled to be within 5%, i.e., stage 5 may be regarded as the constant current stage.

In some embodiments of the present disclosure, in stage 5, the power adapter monitors the impedance of a charging loop in real time, i.e., the power adapter monitors the impedance of the whole charging loop by measuring the output voltage of the power adapter, the charging current and the read-out voltage of the battery in the terminal. When the impedance of the charging loop>the path impedance of the terminal+the impedance of the second charging data wire, it may be considered that there is the poor USB contact, and thus a second charging reset is performed.

In some embodiments of the present disclosure, after the second charging mode is started, a time interval of communications between the power adapter and the terminal may be controlled to be in a certain range, such that the second charging reset can be avoided.

In some embodiments of the present disclosure, the termination of the second charging mode (or the second charging process) may be a recoverable termination or an unrecoverable termination.

For example, when the terminal detects that the battery is fully charged or there is the poor USB contact, the second charging is stopped and reset, and the second charging communication procedure goes into stage 1. When the terminal disagrees to operate in the second charging mode, the second charging communication procedure would not go into stage 2, thus the termination of the second charging process may be considered as an unrecoverable termination.

For another example, when an exception occurs in the communication between the terminal and the power adapter, the second charging is stopped and reset, and the second charging communication procedure goes into stage 1. After requirements for stage 1 are met, the terminal agrees to operate in the second charging mode to recover the second charging process, thus the termination of the second charging process may be considered as a recoverable termination.

For another example, when the terminal detects an exception occurring in the battery, the second charging is stopped and reset, and the second charging communication procedure goes into stage 1. After the second charging communication procedure goes into stage 1, the terminal disagrees to operate in the second charging mode. Till the battery returns to normal and the requirements for stage 1 are met, the terminal agrees to operate in the second charging to recover the second charging process. Thus, the termination of second charging process may be considered as a recoverable termination.

Communication actions or operations illustrated in FIG. 6 are merely exemplary. For example, in stage 1, after the terminal is coupled to the power adapter, the handshake communication between the terminal and the power adapter may be initiated by the terminal. In other words, the terminal sends an instruction 1 to query the power adapter whether to operate in the second charging mode (or flash charging). When receiving a reply instruction indicating that the power adapter agrees to operate in the second charging mode from the power adapter, the terminal operates in the second charging process.

Communication actions or operations illustrated in FIG. 6 are merely exemplary. For example, after stage 5, there is a constant voltage charging stage. In other words, in stage 5, the terminal may feedback the current voltage of the battery in the terminal to the power adapter. As the voltage of the battery increases continuously, the charging goes into the constant voltage charging stage when the current voltage of the battery reaches a constant voltage charging voltage threshold. The control unit 107 adjusts the duty ratio of the PWM signal according to the voltage reference value (i.e., the constant voltage charging voltage threshold), such that the output voltage of the power adapter meets the charging voltage requirement of the terminal, i.e., the output voltage of the power adapter basically changes at a constant rate. During the constant voltage charging stage, the charging current decreases gradually. When the current reduces to a certain threshold, the charging is stopped and it is illustrated that the battery is fully charged. The constant voltage charging refers to that the peak voltage with the third ripple waveform basically keeps constant.

In embodiments of the present disclosure, acquiring output voltage of the power adapter means that the peak value or mean value of voltage with the third ripple waveform is acquired. Acquiring output current of the power adapter means that the peak value or mean value of current with the third ripple waveform is acquired.

Figure 7A:
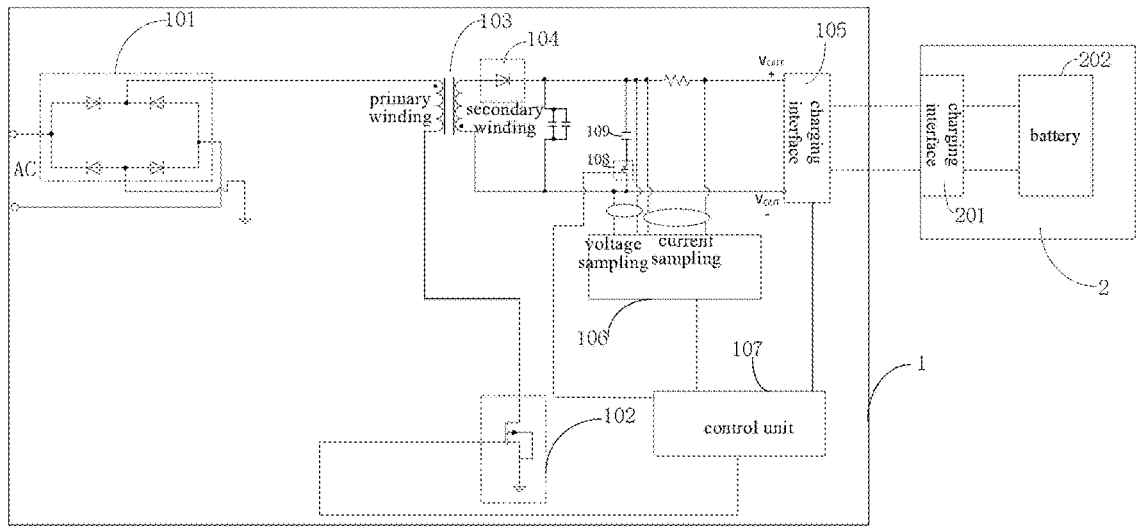
FIG. 7A is a schematic diagram illustrating a charging system according to an embodiment of the present disclosure.
Figure 7B:
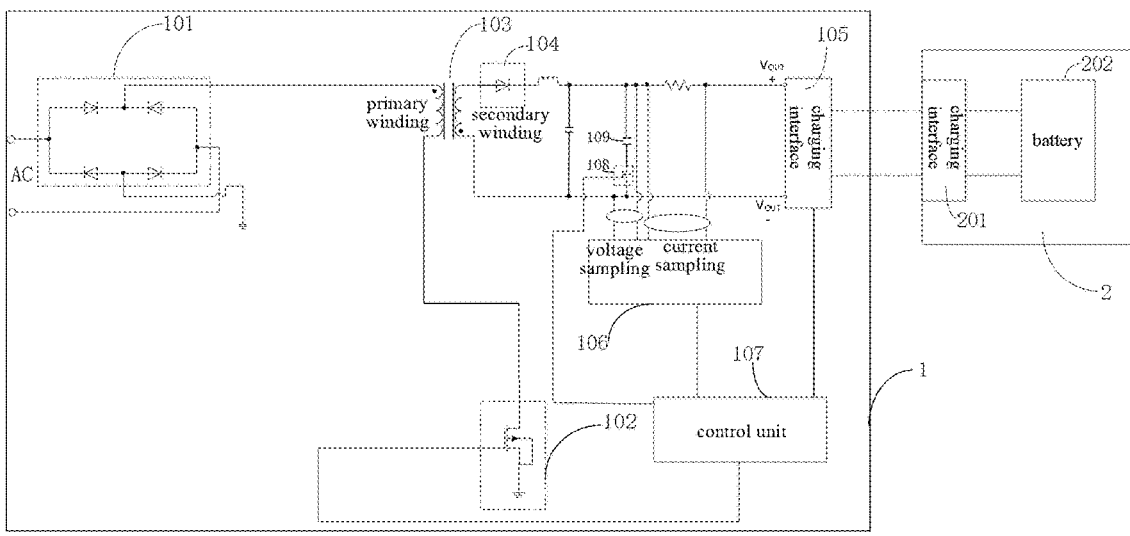
FIG. 7B is a schematic diagram illustrating a power adapter with a LC filter circuit according to an embodiment of the present disclosure.

In an embodiment of the present disclosure, as illustrated in FIG. 7, the power adapter 1 further includes a controllable switch 108 and a filtering unit 109 in series. The controllable switch 108 and the filtering unit 109 in series are coupled to the first output end of the second rectifier 104. The control unit 107 is further configured to control the controllable switch 108 to switch on when determining the charging mode as the first charging mode, and to control the controllable switch 108 to switch off when determining the charging mode as the second charging mode. The output end of the second rectifier 104 is further coupled to one or more groups of small capacitors in parallel, which can not only realize a noise reduction, but also reduce the occurrence of surge phenomenon. The output end of the second rectifier 104 is further coupled to an LC filtering circuit or 7E type filtering circuit, so as to filter out ripple interference. As illustrated in FIG. 7B, the output end of the second rectifier 104 is coupled to an LC filtering circuit. It should be noted that, all capacitors in the LC filtering circuit or the 7E type filtering circuit are small capacitors, which occupy small space.

The filtering unit 109 includes a filtering capacitor, which supports a standard charging of 5V corresponding to the first charging mode. The controllable switch 108 may be formed of a semiconductor switch element such as a MOS transistor. When the power adapter charges the battery in the terminal in the first charging mode (or called as standard charging), the control unit 107 controls the controllable switch 108 to switch on so as to incorporate the filtering unit 109 into the circuit, such that a filtering can be performed on the output of the second rectifier 104. In this way, the direct charging technology is compatible, i.e., the direct current is applied to the battery in the terminal so as to realize direct current charging of the battery. For example, in general, the filtering unit includes an electrolytic condenser and a common capacitor such as a small capacitor supporting standard charging of 5V (for example, a solid-state capacitor) in parallel. Since the electrolytic condenser occupies a bigger volume, in order to reduce the size of the power adapter, the electrolytic condenser may be removed from the power adapter and only one capacitor with low capacitance is left. When the first charging mode is adopted, a branch where the small capacitor is located is switched on, and the current is filtered to realize a stable output with low power for performing a direct current charging on the battery. When the second charging mode is adopted, a branch where the small capacitor is located is switched off, and the output of the second rectifier 104 directly apply the voltage/current with ripple waveform without filtering to the battery, so as to realize a second charging of the battery.

According to an embodiment of the present disclosure, the control unit 107 is further configured to obtain the charging current and/or the charging voltage corresponding to the second charging mode according to the status information of the terminal and to adjust the duty ratio of the control signal such as the PWM signal according to the charging current and/or the charging voltage corresponding to the second charging mode, when determining the charging mode as the second charging mode. In other words, when determining the current charging mode as the second charging mode, the control unit 107 obtains the charging current and/or the charging voltage corresponding to the second charging mode according to the obtained status information of the terminal such as the voltage, the electric quantity and the temperature of the battery, running parameters of the terminal and power consumption information of applications running on the terminal, and adjusts the duty ratio of the control signal according to the charging current and/or the charging voltage, such that the output of the power adapter meets the charging requirement, thus realizing the second charging of the battery.

The status information of the terminal includes the temperature of the terminal. When the temperature of the battery is greater than a first predetermined temperature threshold, or the temperature of the battery is less than a second predetermined temperature threshold, if the current charging mode is the second charging mode, the second charging mode is switched to the first charging mode. The first predetermined temperature threshold is greater than the second predetermined temperature threshold. In other words, when the temperature of the battery is too low (for example, corresponding to less than the second predetermined temperature threshold) or too high (for example, corresponding to greater than the first predetermined temperature threshold), it is unsuitable to perform the second charging, such that it needs to switch from the second charging mode to the first charging mode. In embodiments of the present disclosure, the first predetermined temperature threshold and the second predetermined temperature threshold can be set according to actual situations, or can be written into the storage of the control unit (such as the MCU of the power adapter).

In an embodiment of the present disclosure, the control unit 107 is further configured to control the switch unit 102 to switch off when the temperature of the battery is greater than a predetermined high temperature protection threshold. Namely, when the temperature of the battery exceeds the high temperature protection threshold, the control unit 107 needs to apply a high temperature protection strategy to control the switch unit 102 to switch off, such that the power adapter stops charging the battery, thus realizing the high protection of the battery and improving the safety of charging. The high temperature protection threshold may be different from or the same to the first temperature threshold.

In an embodiment, the high temperature protection threshold is greater than the first temperature threshold.

In another embodiment of the present disclosure, the controller is further configured to obtain the temperature of the battery, and to control the charging control switch to switch off (i.e., the charging control switch can be switched off at the terminal side) when the temperature of the battery is greater than the predetermined high temperature protection threshold, so as to stop the charging process of the battery and to ensure the safety of charging.

Moreover, in an embodiment of the present disclosure, the control unit is further configured to obtain a temperature of the first charging interface, and to control the switch unit to switch off when the temperature of the first charging interface is greater than a predetermined protection temperature. In other words, when the temperature of the charging interface exceeds a certain temperature, the control unit 107 needs to apply the high temperature protection strategy to control the switch unit 102 to switch off, such that the power adapter stops charging the battery, thus realizing the high protection of the battery and improving the safety of charging.

Certainly, in another embodiment of the present disclosure, the controller obtains the temperature of the first charging interface by performing the bidirectional communication with the control unit. When the temperature of the first charging interface is greater than the predetermined protection temperature, the controller controls the charging control switch to switch off (see FIG. 13 and FIG. 14), i.e., switches off the charging control switch at the terminal side, so as to stop the charging process of the battery, thus ensuring the safety of charging.

Figure 8:
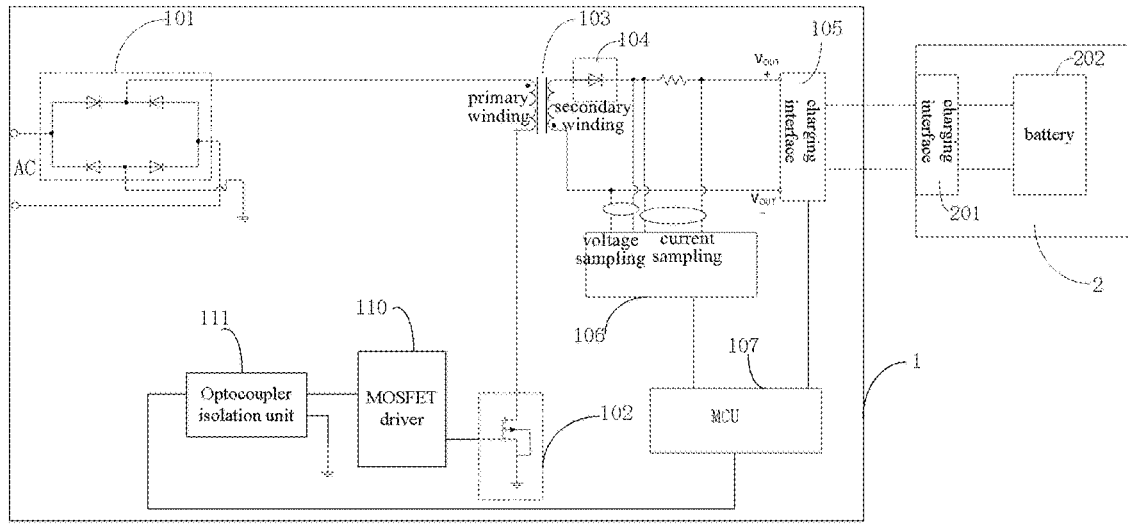
FIG. 8 is a schematic diagram illustrating a charging system according to another embodiment of the present disclosure.

In detail, in an embodiment of the present disclosure, as illustrated in FIG. 8, the power adapter 1 further includes a driving unit 110 such as a MOSFET driver. The driving unit 110 is coupled between the switch unit 102 and the control unit 107. The driving unit 110 is configured to drive the switch unit 102 to switch on or off according to the control signal. Certainly, it should be noted, in other embodiments of the present disclosure, the driving unit 110 may also be integrated in the control unit 107.

Further, as illustrated in FIG. 8, the power adapter 1 further includes an isolation unit 111. The isolation unit 111 is coupled between the driving unit 110 and the control unit 107, to prevent high voltages from affecting the control unit 107 at the secondary side of the transformer 103, i.e. realize a high-voltage isolation between the primary side and the secondary side of the power adapter 1 (or a high-voltage isolation between the primary winding and the secondary winding of the transformer 103). The isolation unit 111 may be implemented in an optocoupler isolation manner, or in other isolation manners. By setting the isolation unit 111, the control unit 107 may be disposed at the secondary side of the power adapter 1 (or the secondary winding side of the transformer 103), such that it is convenient to communicate with the terminal 2, and the space design of the power adapter 1 becomes easier and simpler.

Certainly, it should be understood that, in other embodiments of the present disclosure, both the control unit 107 and the driving unit 110 can be disposed as the primary side, in this way, an isolation unit such as the isolation unit 111 can be disposed between the control unit 107 and the sampling unit 106, so as to prevent high voltages from affecting the control unit 107 at the secondary side of the transformer 103, i.e. realize the high-voltage isolation between the primary side and the secondary side of the power adapter 1.

Further, in embodiments of the present disclosure, when the control unit 107 is disposed at the secondary side, the isolation unit 111 is required, and the isolation unit 111 may be integrated in the control unit 107. In other words, when the signal is transmitted from the primary side to the secondary side or from the secondary side to the primary side, the isolation unit 111 is required to prevent high voltages from affecting the control unit 107 at the secondary side of the transformer 103, i.e. realize the high-voltage isolation.

Figure 9:
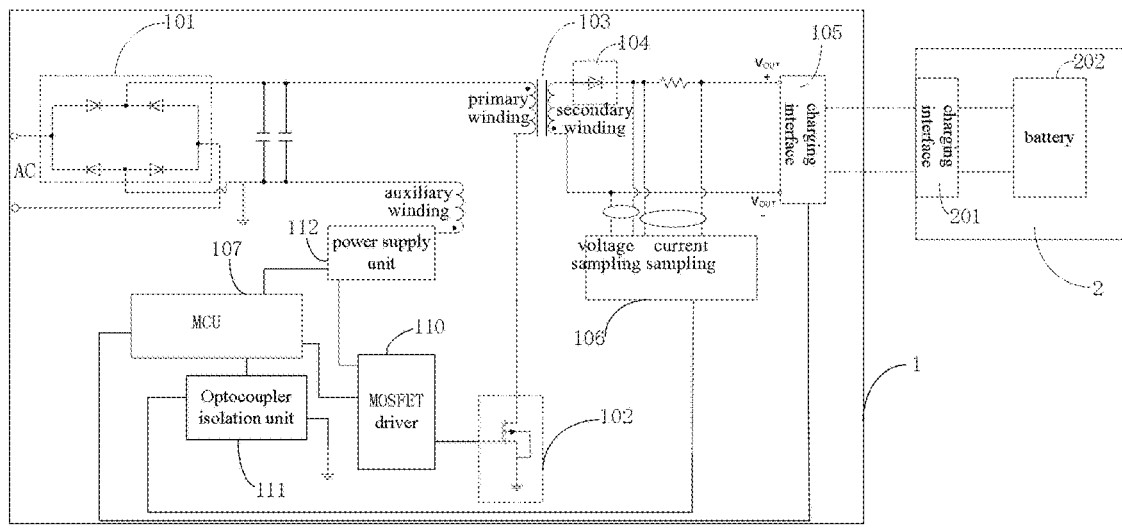
FIG. 9 is a schematic diagram illustrating a charging system according to yet another embodiment of the present disclosure.

In an embodiment of the present disclosure, as illustrated in FIG. 9, the power adapter 1 further includes an auxiliary winding and a power supply unit 112. The auxiliary winding generates a fourth voltage with a fourth ripple waveform according to the modulated first voltage. The power supply unit 112 is coupled to the auxiliary winding. The power supply unit 112 (for example, including a filtering voltage regulator module, a voltage converting module and the like) is configured to convert the fourth voltage with the fourth ripple waveform and output a direct current, and to supply power to the driving unit 110 and/or the control unit 107 respectively. The power supply unit 112 may be formed of a small filtering capacitor, a voltage regulator chip or other elements, performs a process and conversation on the fourth voltage with the fourth ripple waveform and outputs the low voltage direct current such as 3.3V, 5V or the like.

In other words, the power supply of the driving unit 110 can be obtained by performing a voltage conversation on the fourth voltage with the fourth ripple waveform by the power supply unit 112. When the control unit 107 is disposed at the primary side, the power supply of the control unit 107 can also be obtained by performing a voltage conversation on the fourth voltage with the fourth ripple waveform by the power supply unit 112. As illustrated in FIG. 9, when the control unit 107 is disposed at the primary side, the power supply unit 112 provides two lines of direct current outputs, so as to supply power to the driving unit 110 and the control unit 107 respectively. An optocoupler isolation unit 111 is arranged between the control unit 107 and the sampling unit 106 so as to prevent high voltages from affecting the control unit 107 at the secondary side of the transformer 103, i.e. realize the high-voltage isolation between the primary side and the secondary side of the power adapter 1.

When the control unit 107 is disposed at the primary side and integrated with the driving unit 110, the power supply unit 112 supplies power to the control unit 107 only. When the control unit 107 is disposed at the secondary side and the driving unit 110 is disposed at the primary side, the power supply unit 112 supplies power to the driving unit 110 only. The power supply to the control unit 107 is realized by the secondary side, for example, a power supply unit converts the third voltage with the third ripple waveform outputted by the second rectifier 104 to direct current to supply power to the control unit 107.

Moreover, in embodiments of the present disclosure, several small capacitors are coupled in parallel to the output end of first rectifier 101 for filtering. Or the output end of the first rectifier 110 is coupled to an LC filtering circuit.

Figure 10:
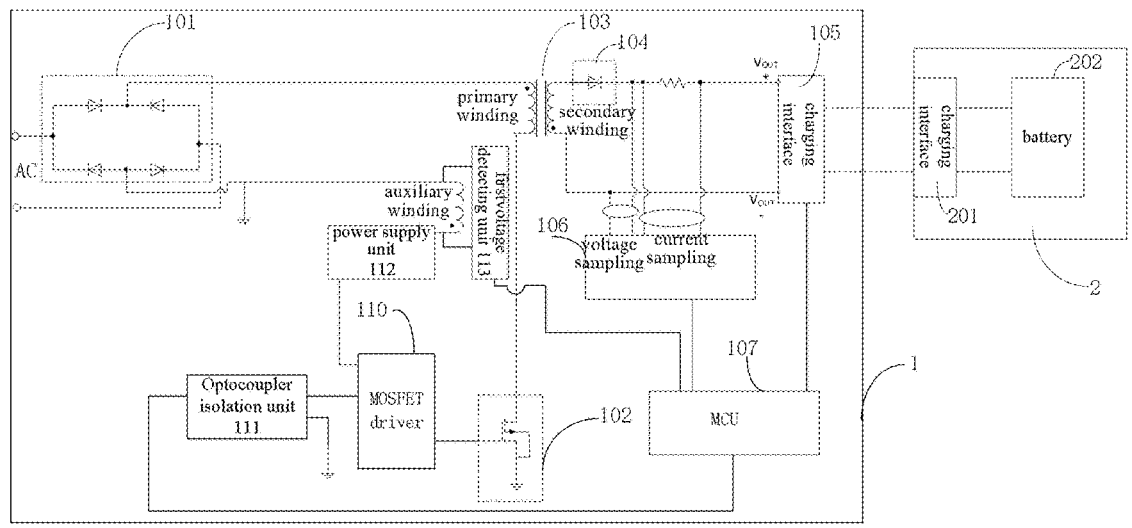
FIG. 10 is a schematic diagram illustrating a charging system according to still another embodiment of the present disclosure.

In another embodiment of the present disclosure, as illustrated in FIG. 10, the power adapter 1 further includes a first voltage detecting unit 113. The first voltage detecting unit 113 is coupled to the auxiliary winding and the control unit 107 respectively. The first voltage detecting unit 113 is configured to detect the fourth voltage to generate a voltage detecting value. The control unit 107 is further configured to adjust the duty ratio of the control signal according to the voltage detecting value.

In other words, the control unit 107 may reflect the voltage outputted by the second rectifier 104 with the voltage outputted by the secondary winding and detected by the first voltage detecting unit 113, and then adjusts the duty ratio of the control signal according to the voltage detecting value, such that the output of the second rectifier 104 meets the charging requirement of the battery.

Figure 11:
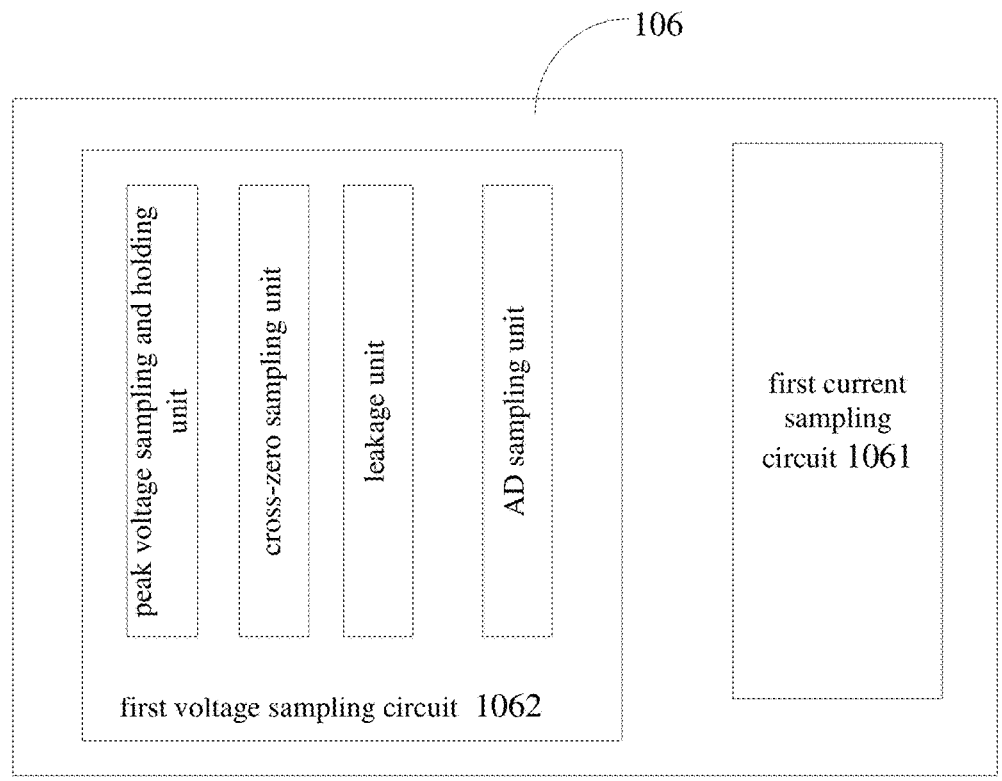
FIG. 11 is a block diagram of a sampling unit according to an embodiment of the present disclosure.

In detail, in an embodiment of the present disclosure, as illustrated in FIG. 11, the sampling unit 106 includes a first current sampling circuit 1061 and a first voltage sampling circuit 1062. The first current sampling circuit 1061 is configured to sample the current outputted by the second rectifier 104 so as to obtain the current sampling value. The first voltage sampling circuit 1062 is configured to sample the voltage outputted by the second rectifier 104 so as to obtain the voltage sampling value.

In an embodiment of the present disclosure, the first current sampling circuit 1061 can sample the current outputted by the second rectifier 104 by sampling voltage on a resistor (current detection resistor) coupled to the first output end of the second rectifier 104. The first voltage sampling circuit 1062 can sample the voltage outputted by the second rectifier 104 by sampling the voltage cross the first output end and the second output end of the second rectifier 104.

Moreover, in an embodiment of the present disclosure, as illustrated in FIG. 11, the first voltage sampling circuit 1062 includes a peak voltage sampling and holding unit, a cross-zero sampling unit, a leakage unit and an AD sampling unit. The peak voltage sampling and holding unit is configured to sample and hold a peak voltage of the third voltage. The cross-zero sampling unit is configured to sample a zero crossing point of the third voltage. The leakage unit is configured to perform a leakage on the peak voltage sampling and holding unit at the zero crossing point. The AD sampling unit is configured to sample the peak voltage in the peak voltage sampling and holding unit so as to obtain the voltage sampling value.

By providing with the peak voltage sampling and holding unit, the cross-zero sampling unit, the leakage unit and the AD sampling unit in the first voltage sampling circuit 1062, the voltage outputted by the second rectifier 104 may be sampled accurately, and it can be guaranteed that the voltage sampling value keeps synchronous with the first voltage, i.e., the phase and variation trend of magnitude of the voltage sampling value are consistent with those of the first voltage respectively.

Figure 12:
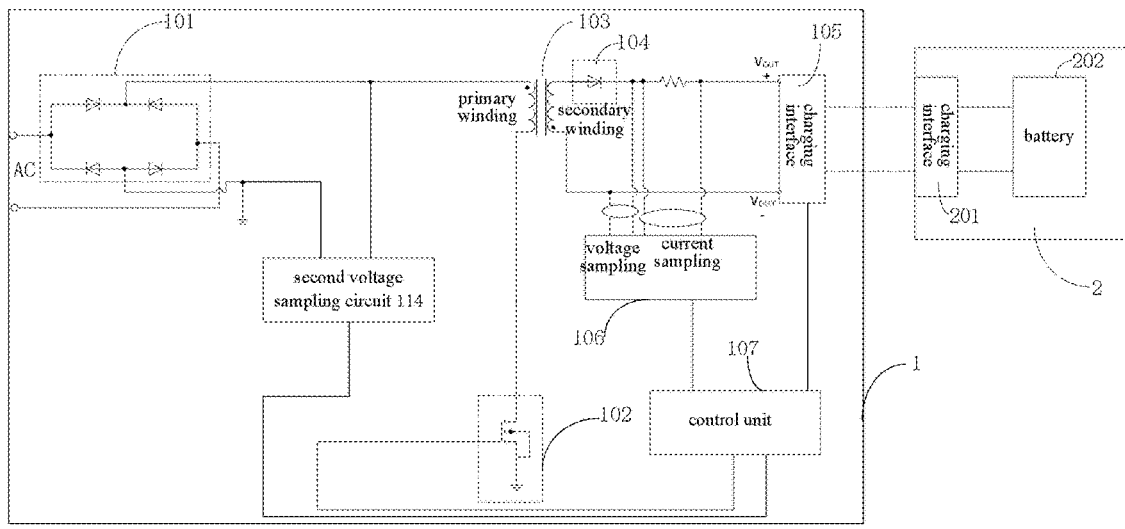
FIG. 12 is a schematic diagram illustrating a charging system according to still yet another embodiment of the present disclosure.

According to an embodiment of the present disclosure, as illustrated in FIG. 12, the power adapter 1 further includes a second voltage sampling circuit 114. The second voltage sampling circuit 114 is configured to sample the first voltage with the first ripple waveform. The second voltage sampling circuit 114 is coupled to the control unit 107. When the voltage value sampled by the second voltage sampling circuit 114 is greater than a first predetermined voltage value, the control unit 104 controls the switch unit 102 to switch on for a predetermined time period, for performing a discharge on the surge voltage, spike voltage in the first voltage with the first ripple waveform.

As illustrated in FIG. 12, the second voltage sampling circuit 114 can be coupled to the first output end and the second output end of the first rectifier 101, so as to sample the first voltage with the first ripple waveform. The control unit 107 performs a determination on the voltage value sampled by the second voltage sampling circuit 114. When the voltage value sampled by the second voltage sampling circuit 114 is greater than the first predetermined voltage value, it indicates that the power adapter 1 is disturbed by lightning stroke and the surge voltage is generated. At this time, a leakage is required for the surge voltage to ensure the safety and reliability of charging. The control unit 107 controls the switch unit 102 to switch on for a certain time period, to form a leakage circuit, such that the leakage is performed on the surge voltage caused by lightning stroke, thus avoiding the disturbance caused by the lightning stroke when the power adapter charges the terminal, and effectively improving the safety and reliability of the charging of the terminal. The first predetermined voltage value may be determined according to actual situations.

In an embodiment of the present disclosure, during a process that the power adapter 1 charges the battery 202 of the terminal 2, the control unit 107 is further configured to control the switch unit 102 to switch off when the voltage sampling value sampled by the sampling unit 106 is greater than a second predetermined voltage value. Namely, the control unit 107 further performs a determination on the voltage sampling value sampled by the sampling unit 106. When the voltage sampling value sampled by the sampling unit 106 is greater than the second predetermined voltage value, it indicates that the voltage outputted by the power adapter 1 is too high. At this time, the control unit 107 controls the power adapter to stop charging the battery 202 of the terminal 2 by controlling the switch unit 102 to switch off. In other words, the control unit 107 realizes the over-voltage protection of the power adapter 1 by controlling the switch unit 102 to switch off, thus ensuring the safety of charging.

Certainly, in an embodiment of the present disclosure, the controller 204 obtains the voltage sampling value sampled by the sampling unit 106 by performing a bidirectional communication with the control unit 107 (see in FIG. 13 and FIG. 14), and controls the charging control switch 203 to switch off when the voltage sampling value sampled by the sampling unit 106 is greater than the second predetermined voltage value. Namely, the charging control switch 203 is controlled to switch off at the terminal side, so as to stop the charging process of the battery 202, such that the safety of charging the battery 202 can be ensured.

Further, the control unit 107 is further configured to control the switch unit 102 to switch off when the current sampling value sampled by the sampling unit 106 is greater than a predetermined current value. In other words, the control unit 107 further performs a determination on the current sampling value sampled by the sampling unit 106. When the current sampling value sampled by the sampling unit 106 is greater than the predetermined current value, it indicates that the current outputted by the power adapter 1 is too high. At this time, the control unit 107 controls the power adapter 1 to stop charging the terminal by controlling the switch unit 102 to switch off. In other words, the control unit 107 realizes the over-current protection of the power adapter 1 by controlling the switch unit 102 to switch off, thus ensuring the safety of charging.

Similarly, the controller 204 obtains the current sampling value sampled by the sampling unit 106 by performing the bidirectional communication with the control unit 107 (see FIG. 13 and FIG. 14), and controls to switch off the charging control switch 203 when the current sampling value sampled by the sampling unit 106 is greater than the predetermined current value. In other words, the charging control switch 203 is controlled to be switched off at the terminal side, so as to stop the charging process of the battery 202, thus ensuring the safety of charging.

The second predetermined voltage value and the predetermined current value may be set or written into a storage of the control unit (for example, the control unit 107 of the power adapter 1, such as the MCU of the power adapter) according to actual situations.

In embodiments of the present disclosure, the terminal may be a mobile terminal, such as a mobile phone, a mobile power supply such as a power bank, a multimedia player, a notebook PC, a wearable device or the like.

With the charging system according to embodiments of the present disclosure, the power adapter is controlled to output the third voltage with the third ripple waveform, and the third voltage with the third ripple waveform outputted by the power adapter is directly applied to the battery of the terminal, thus realizing second charging to the battery directly by the ripple output voltage/current. In contrast to the constant voltage and constant current, a magnitude of the ripple output voltage/current changes periodically, such that a lithium precipitation of the lithium battery may be reduced, the service life of the battery may be improved, and a probability and intensity of arc discharge of a contact of a charging interface may be reduced, the service life of the charging interface may be prolonged, and it is beneficial to reduce polarization effect of the battery, improve charging speed, and decrease heat emitted by the battery, thus ensuring a reliability and safety of the terminal during the charging. Moreover, since the power adapter outputs the voltage with the ripple waveform, it is unnecessary to provide an electrolytic condenser in the power adapter, which not only realizes simplification and miniaturization of the power adapter, but also decreases cost greatly.

Embodiments of the present disclosure further provide a power adapter. The power adapter includes a first rectifier, a switch unit, a transformer, a second rectifier, a sampling unit and a control unit. The first rectifier is configured to rectify an input alternating current and output a first voltage with a first ripple waveform. The switch unit is configured to modulate the first voltage according to a control signal and output a modulated first voltage. The transformer is configured to output a second voltage with a second ripple waveform according to the modulated first voltage. The second rectifier is configured to rectify the second voltage to output a third voltage with a third ripple waveform, in which the third voltage is configured to be introduced into a terminal to charge a battery in the terminal when the power adapter is coupled to the terminal. The sampling unit is configured to sample current outputted by the second rectifier to obtain a current sampling value. The control unit is coupled to the sampling unit and the switch unit respectively, and configured to output the control signal to the switch unit, and to control a charging process performed by the power adapter on a terminal to be in a constant current charging stage by adjusting a duty ratio of the control signal when it is determined that current outputted by the power adapter is high or low according to the current sampling value.

In an embodiment, the power adapter further includes a first charging interface. The first charging interface is coupled to the second rectifier, configured to apply the third voltage to a battery in a terminal via a second charging interface of the terminal when the first charging interface is coupled to the second charging interface, in which the second charging interface is coupled to the battery.

With the power adapter according to embodiments of the present disclosure, the third voltage with the third ripple waveform is outputted via the first charging interface, and the third voltage is directly applied to the battery of the terminal via the second charging interface of the terminal, thus realizing second charging to the battery directly by the ripple output voltage/current. In contrast to the conventional constant voltage and constant current, a magnitude of the ripple output voltage/current changes periodically, such that a lithium precipitation of the lithium battery may be reduced, the service life of the battery may be improved, and a probability and intensity of arc discharge of a contact of a charging interface may be reduced, the service life of the charging interface may be prolonged, and it is beneficial to reduce polarization effect of the battery, improve charging speed, and decrease heat emitted by the battery, thus ensuring a reliability and safety of the terminal during the charging. Moreover, since the voltage with the ripple waveform is output, it is unnecessary to provide an electrolytic condenser, which not only realizes simplification and miniaturization of the power adapter, but also decreases cost greatly.

Figure 15:
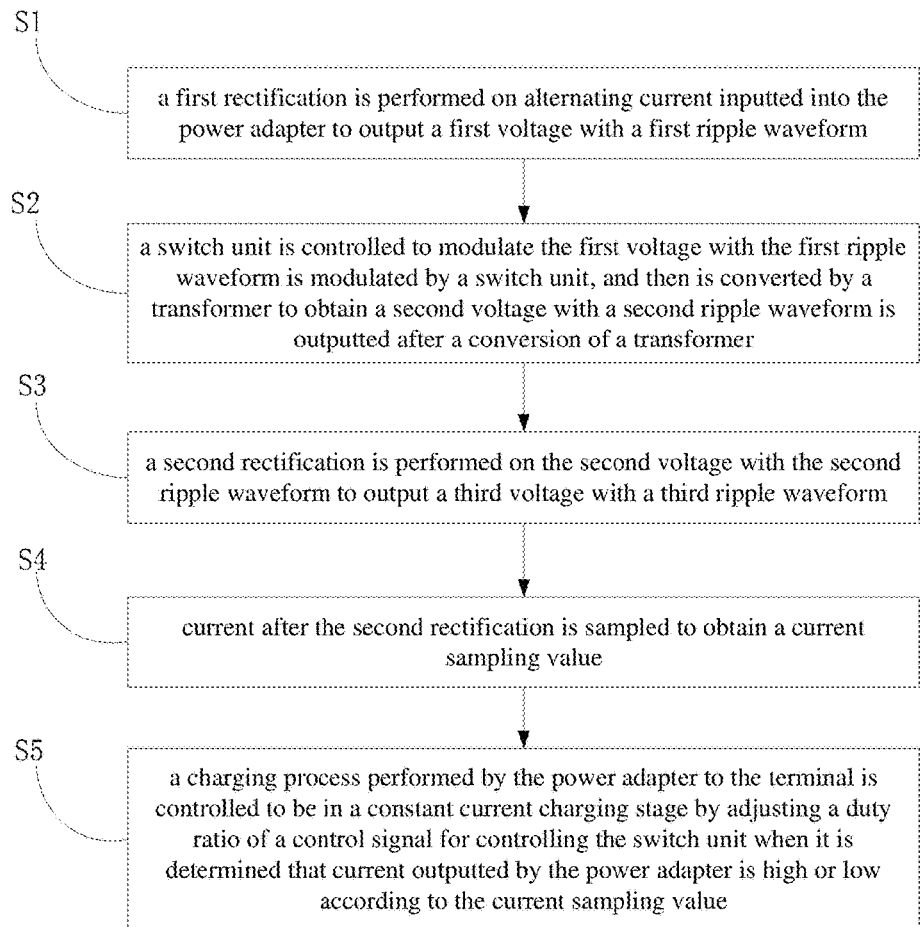
FIG. 15 is a flow chart of a charging method according to embodiments of the present disclosure.

FIG. 15 is a flow chart of a charging method according to embodiments of the present disclosure. As illustrated in FIG. 15, the charging method includes the followings.

At block S1, when a power adapter is coupled to a terminal, a first rectification is performed on alternating current inputted into the power adapter to output a first voltage with a first ripple waveform.

In other words, a first rectifier in the power adapter rectifies the inputted alternating current (i.e., the mains supply, such as alternating current of 220V, 50 Hz or 60 Hz) and outputs the first voltage (for example, 100 Hz or 120 Hz) with the first ripple waveform, such as a voltage with a steamed bun waveform.

At block S2, the first voltage with the first ripple waveform is modulated by a switch unit, and then is converted by a transformer to obtain a second voltage with a second ripple waveform.

The switch unit may be formed of a MOS transistor. A PWM control is performed on the MOS transistor to perform a chopping modulation on the voltage with the steamed bun waveform. And then, the modulated first voltage is coupled to a secondary side by the transformer, such that the secondary winding outputs the second voltage with the second ripple waveform.

In an embodiment of the present disclosure, a high-frequency transformer is used for conversion, such that the size of the transformer is small, thus realizing miniaturization of the power adapter with high-power.

At block S3, a second rectification is performed on the second voltage with the second ripple waveform to output a third voltage with a third ripple waveform. The third voltage with the third ripple waveform may be applied to a battery of the terminal via the second charging interface, so as to charge the battery of the terminal.

In an embodiment of the present disclosure, the second rectification is performed by a second rectifier on the second voltage with the second ripple waveform. The second rectifier may be formed of a diode or a MOS transistor, and can realize a secondary synchronous rectification, such that the third ripple waveform keeps synchronous with the waveform of the modulated first voltage.

At block S4, current after the second rectification is sampled to obtain a current sampling value.

At block S5, a charging process performed by the power adapter on the terminal is controlled to be in a constant current charging stage by adjusting a duty ratio of a control signal for controlling the switch unit when it is determined that current outputted by the power adapter is high or low according to the current sampling value.

In an embodiment, when the current outputted by the power adapter is high or low, a peak current/a mean current of the third ripple waveform outputted by the second rectifier is higher or lower than a current reference value of the constant current charging stage, i.e. higher or lower than the current reference value of the constant current charging stage by a certain preset value.

In an embodiment of the present disclosure, the duty ratio of the control signal is reduced when the current outputted by the power adapter is high, such that the current outputted by the power adapter is reduced to the current reference value. The duty ratio of the control signal is increased when the current outputted by the power adapter is low, such that the current outputted by the power adapter is increased to the current reference value.

In an embodiment of the present disclosure, the above charging method further includes: sampling voltage after the second rectification to obtain a voltage sampling value; and after the constant current stage is completed, controlling the charging process performed by the power adapter on the terminal to be in a constant voltage charging stage by adjusting the duty ratio of the control signal when it is determined that that voltage outputted by the power adapter is high or low according to the voltage sampling value.

In an embodiment, when the voltage outputted by the power adapter is high or low, a peak voltage/a mean voltage of the third ripple waveform outputted by the second rectifier is higher or lower than a voltage reference value of the constant voltage charging stage, i.e. is higher or lower than the voltage reference value of the constant voltage charging stage by a certain preset value.

In an embodiment of the present disclosure, the duty ratio of the control signal is reduced when the voltage outputted by the power adapter is high, such that the voltage outputted by the power adapter is reduced to the voltage reference value. The duty ratio of the control signal is increased when the voltage outputted by the power adapter is low, such that the voltage outputted by the power adapter is increased to the voltage reference value.

Further, in an embodiment of the present disclosure, the duty radio of the control signal is adjusted so as to make the third voltage with the third ripple waveform meet the charging requirement.

In an embodiment, the third voltage with the third ripple waveform meeting the charging requirement means that, the third voltage and current with the third ripple waveform need to meet the charging voltage and charging current when the battery is charged. In other words, the duty ratio of the control signal (such as a PWM signal) is adjusted according to the sampled voltage and/or current outputted by the power adapter, so as to adjust the output of the power adapter in real time and realize a closed-loop adjusting control, such that the third voltage with the third ripple waveform meets the charging requirement of the terminal, thus ensuring the stable and safe charging of the battery. In detail, a waveform of a charging voltage outputted to a battery is illustrated in FIG. 3, in which the waveform of the charging voltage is adjusted according to the duty ratio of the PWM signal. A waveform of a charging current outputted to a battery is illustrated in FIG. 4, in which the waveform of the charging current is adjusted according to the duty ratio of the PWM signal.

In an embodiment of the present disclosure, by controlling the switch unit, a chopping modulation is directly performed on the first voltage with the first ripple waveform i.e., the steamed bun waveform after a full-bridge rectification, and then a modulated voltage is sent to the high-frequency transformer and is coupled from the primary side to the secondary side via the high-frequency transformer, and then is changed back to the voltage/current with the steamed bun waveform after a synchronous rectification. The voltage/current with the steamed bun waveform is directly transmitted to the battery so as to realize second charging to the battery. The magnitude of the voltage with the steamed bun waveform may be adjusted according to the duty ratio of the PWM signal, such that the output of the power adapter may meet the charging requirement of the battery. It can be seen from that, electrolytic condensers at the primary side and the secondary side in the power adapter can be removed, and the battery can be directly charged via the voltage with the steamed bun waveform, such that a size of the power adapter may be reduced, thus realizing miniaturization of the power adapter, and decreasing cost greatly.

According to an embodiment of the present disclosure, a frequency of the control signal is adjusted according to the voltage sampling value and/or the current sampling value. That is, the output of the PWM signal to the switch unit is controlled to maintain for a continuous time period, and then stop for a predetermined time period and then restart. In this way, the voltage applied to the battery is intermittent, thus realizing the intermittent charging of the battery, which avoids a safety hazard caused by heating phenomenon occurring when the battery is charged continuously and improves the reliability and safety of the charging to the battery. The control signal outputted to the switch unit is illustrated in FIG. 5.

Further, the above charging method includes: performing a communication with the terminal via the first charging interface to obtain status information of the terminal, and adjusting the duty ratio of the control signal according to the status information of the terminal, the voltage sampling value and/or current sampling value.

In other words, when the second charging interface is coupled to the first charging interface, the power adapter and the terminal may send communication query instructions to each other, and a communication connection can be established between the power adapter and the terminal after corresponding reply instructions are received, such that the power adapter can obtain the status information of the terminal, negotiates with the terminal about the charging mode and the charging parameter (such as the charging current, the charging voltage) and controls the charging process.

According to an embodiment of the present disclosure, a fourth voltage with a fourth ripple waveform can be generated by a conversion of the transformer, and the fourth voltage with the fourth ripple waveform can be detected to generate a voltage detecting value, and the duty ratio of the control signal can be adjusted according to the voltage detecting value.

In detail, the transformer can be provided with an auxiliary winding. The auxiliary winding can generate the fourth voltage with the fourth ripple waveform according to the modulated first voltage. The output voltage of the power adapter can be reflected by detecting the fourth voltage with the fourth ripple waveform, and the duty ratio of the control signal can be adjusted according to the voltage detecting value, such that the output of the power adapter meets the charging requirement of the battery.

In an embodiment of the present disclosure, sampling voltage after the second rectification to obtain a voltage sampling value includes: sampling and holding a peak voltage of the voltage after the second rectification, and sampling a zero crossing point of the voltage after the second rectification; performing a leakage on a peak voltage sampling and holding unit configured for sampling and holding the peak voltage at the zero crossing point; and sampling the peak voltage in the peak voltage sampling and holding unit so as to obtain the voltage sampling value. In this way, an accurate sampling can be performed on the voltage outputted by the power adapter, and it can be guaranteed that the voltage sampling value keeps synchronous with the first voltage with the first ripple waveform, i.e., the phase and variation trend of magnitude of the voltage sampling value are consistent with those of the first voltage respectively.

Further, in an embodiment of the present disclosure, the above charging method includes: sampling the first voltage with the first ripple waveform, and controlling the switch unit to switch on for a predetermined time period for performing a discharge on surge voltage in the first voltage with the first ripple waveform when a sampled voltage value is greater than a first predetermined voltage value.

The first voltage with the first ripple waveform is sampled so as to determine the sampled voltage value. When the sampled voltage value is greater than the first predetermined voltage value, it indicates that the power adapter is disturbed by lightning stroke and the surge voltage is generated. At this time, a leakage is required for the surge voltage to ensure the safety and reliability of charging. It is required to control the switch unit to switch on for a certain time period, to form a leakage circuit, such that the leakage is performed on the surge voltage caused by lightning stroke, thus avoiding the disturbance caused by the lightning stroke when the power adapter charges the terminal, and effectively improving the safety and reliability of the charging of the terminal. The first predetermined voltage value may be determined according to actual situations.

According an embodiment of the present disclosure, a communication with the terminal is performed via the first charging interface to determine the charging mode. When the charging mode is determined as the second charging mode, the charging current and/or charging voltage corresponding to the second charging mode can be obtained according to the status information of the terminal, so as to adjust the duty ratio of the control signal according to the charging current and/or charging voltage corresponding to the second charging mode. The charging mode includes the second charging mode and the first charging mode.

In other words, when the current charging mode is determined as the second charging mode, the charging current and/or charging voltage corresponding to the second charging mode can be obtained according to the status information of the terminal, such as the voltage, electric quantity, temperature of the battery, running parameters of the terminal and power consumption information of applications running on the terminal or the like. And the duty ratio of the control signal is adjusted according to the obtained charging current and/or charging voltage, such that the output of the power adapter meets the charging requirement, thus realizing the second charging of the terminal.

The status information of the terminal includes the temperature of the battery. When the temperature of the battery is greater than a first predetermined temperature threshold, or the temperature of the battery is less than a second predetermined temperature threshold, if the current charging mode is the second charging mode, the second charging mode is switched to the first charging mode. The first predetermined temperature threshold is greater than the second predetermined temperature threshold. In other words, when the temperature of the battery is too low (for example, corresponding to less than the second predetermined temperature threshold) or too high (for example, corresponding to greater than the first predetermined temperature threshold), it is unsuitable to perform the second charging, such that it needs to switch from the second charging mode to the first charging mode. In embodiments of the present disclosure, the first predetermined temperature threshold and the second predetermined temperature threshold can be set according to actual situations.

In an embodiment of the present disclosure, the switch unit is controlled to switch off when the temperature of the battery is greater than a predetermined high temperature protection threshold. Namely, when the temperature of the battery exceeds the high temperature protection threshold, it needs to apply a high temperature protection strategy to control the switch unit to switch off, such that the power adapter stops charging the battery, thus realizing the high protection of the battery and improving the safety of charging. The high temperature protection threshold may be different from or the same to the first temperature threshold. In an embodiment, the high temperature protection threshold is greater than the first temperature threshold.

In another embodiment of the present disclosure, the terminal further obtains the temperature of the battery, and controls to stop charging the battery (for example by controlling a charging control switch to switch off at the terminal side) when the temperature of the battery is greater than the predetermined high temperature protection threshold, so as to stop the charging process of the battery and to ensure the safety of charging.

Moreover, in an embodiment of the present disclosure, the charging method further includes: obtaining a temperature of the first charging interface, and controlling the switch unit to switch off when the temperature of the first charging interface is greater than a predetermined protection temperature. In other words, when the temperature of the charging interface exceeds a certain temperature, the control unit needs to apply the high temperature protection strategy to control the switch unit to switch off, such that the power adapter stops charging the battery, thus realizing the high protection of the battery and improving the safety of charging.

Certainly, in another embodiment of the present disclosure, the terminal obtains the temperature of the first charging interface by performing the bidirectional communication with the power adapter via the second charging interface. When the temperature of the first charging interface is greater than the predetermined protection temperature, the terminal controls the charging control switch to switch off, i.e., the charging control switch can be switched off at the terminal side, so as to stop the charging process of the battery, thus ensuring the safety of charging.

During a process that the power adapter charges the terminal, the switch unit is controlled to switch off when the voltage sampling value is greater than a second predetermined voltage value. Namely, a determination is performed on the voltage sampling value during the process that the power adapter charges the terminal. When the voltage sampling value is greater than the second predetermined voltage value, it indicates that the voltage outputted by the power adapter is too high. At this time, the power adapter is controlled to stop charging the terminal by controlling the switch unit to switch off. In other words, the over-voltage protection of the power adapter is realized by controlling the switch unit to switch off, thus ensuring the safety of charging.

Certainly, in an embodiment of the present disclosure, the terminal obtains the voltage sampling value by performing a bidirectional communication with the power adapter via the second charging interface, and controls to stop charging the battery when the voltage sampling value is greater than the second predetermined voltage value. Namely, the charging control switch is controlled to switch off at the terminal side, so as to stop the charging process, such that the safety of charging can be ensured.

In an embodiment of the present disclosure, during the process that the power adapter charges the terminal, the switch unit is controlled to switch off when the current sampling value is greater than a predetermined current value. In other words, during the process that the power adapter charges the terminal, a determination is performed on the current sampling value. When the current sampling value is greater than the predetermined current value, it indicates that the current outputted by the power adapter is too high. At this time, the power adapter is controlled to stop charging the terminal by controlling the switch unit to switch off. In other words, the over-current protection of the power adapter is realized by controlling the switch unit to switch off, thus ensuring the safety of charging.

Similarly, the terminal obtains the current sampling value by performing the bidirectional communication with the power adapter via the second charging interface, and controls to stop charging the battery when the current sampling value is greater than the predetermined current value. In other words, the charging control switch is controlled to be switched off at the terminal side, such that the charging process of the battery is stopped, thus ensuring the safety of charging.

The second predetermined voltage value and the predetermined current value may be set according to actual situations.

In embodiments of the present disclosure, the status information of the terminal includes the electric quantity of the battery, the temperature of the battery, the voltage/current of the battery of the terminal, interface information of the terminal and information on a path impedance of the terminal.

In detail, the power adapter can be coupled to the terminal via a universal serial bus (USB) interface. The USB interface may be a general USB interface, or a micro USB interface. A data wire in the USB interface is configured as the data wire in the first charging interface, and configured for the bidirectional communication between the power adapter and the terminal. The data wire may be D+ and/or D− wire in the USB interface. The bidirectional communication may refer to an information interaction performed between the power adapter and the terminal.

The power adapter performs the bidirectional communication with the terminal via the data wire in the USB interface, so as to determine to charge the terminal in the second charging mode.

As an embodiment, when the power adapter performs the bidirectional communication with the terminal via the first charging interface so as to determine to charge the terminal in the second charging mode, the power adapter sends a first instruction to the terminal. The first instruction is configured to query the terminal whether to operate in the second charging mode. The power adapter receives a first reply instruction from the terminal. The first reply instruction is configured to indicate that the terminal agrees to operate in the second charging mode.

As an embodiment, before the power adapter sends the first instruction to the terminal, the power adapter charges the terminal in the first charging mode. When the power adapter determines that a charging duration of the first charging mode is greater than a predetermined threshold, the power adapter sends the first instruction to the terminal.

In an embodiment, when the power adapter determines that a charging duration of the first charging mode is greater than a predetermined threshold, the power adapter may determine that the terminal has identified it as a power adapter, such that the second charging query communication may start.

As an embodiment, the power adapter is controlled to adjust a charging current to a charging current corresponding to the second charging mode by controlling the switch unit. Before the power adapter charges the terminal with the charging current corresponding to the second charging mode, a bidirectional communication is performed with the terminal via the first charging interface to determine a charging voltage corresponding to the second charging mode, and the power adapter is controlled to adjust a charging voltage to the charging voltage corresponding to the second charging mode.

As an embodiment, performing the bidirectional communication with the terminal via the first charging interface to determine the charging voltage corresponding to the second charging mode includes: sending by the power adapter a second instruction to the terminal, receiving by the power adapter a second reply instruction sent from the terminal, and determining by the power adapter the charging voltage corresponding to the second charging mode according to the second reply instruction. The second instruction is configured to query whether a current output voltage of the power adapter is suitable for being used as the charging voltage corresponding to the second charging mode. The second reply instruction is configured to indicate that the current output voltage of the power adapter is suitable, high or low.

As an embodiment, before controlling the power adapter to adjust the charging current to the charging current corresponding to the second charging mode, the charging current corresponding to the second charging mode is determined by performing the bidirectional communication with the terminal via the first charging interface.

As an embodiment, determining the charging current corresponding to the second charging mode by performing the bidirectional communication with the terminal via the first charging interface includes: sending by the power adapter a third instruction to the terminal, receiving by the power adapter a third reply instruction sent from the terminal and determining by the power adapter the charging current corresponding to the second charging mode according to the third reply instruction. The third instruction is configured to query a maximum charging current supported by the terminal. The third reply instruction is configured to indicate the maximum charging current supported by the terminal.

The power adapter may determine the above maximum charging current as the charging current corresponding to the second charging mode, or may set the charging current as a charging current less than the maximum charging current.

As an embodiment, during the process that the power adapter charges the terminal in the second charging mode, the bidirectional communication is performed with the terminal via the first charging interface, so as to continuously adjust a charging current outputted to the battery from the power adapter by controlling the switch unit.

The power adapter may query the status information of the terminal continuously, so as to adjust the charging current continuously, for example, query the voltage of the battery of the terminal, the electric quantity of the battery, etc.

As an embodiment, performing the bidirectional communication with the terminal via the first charging interface to continuously adjust the charging current outputted to the battery from the power adapter by controlling the switch unit includes: sending by the power adapter a fourth instruction to the terminal, receiving by the power adapter a fourth reply instruction sent by the terminal, and adjusting the charging current by controlling the switch unit according to the current voltage of the battery. The fourth instruction is configured to query a current voltage of the battery in the terminal. The fourth reply instruction is configured to indicate the current voltage of the battery in the terminal.

As an embodiment, adjusting the charging current by controlling the switch unit according to the current voltage of the battery includes: adjusting the charging current outputted to the battery from the power adapter to a charging current value corresponding to the current voltage of the battery by controlling the switch unit according to the current voltage of the battery and a predetermined correspondence between battery voltage values and charging current values.

In detail, the power adapter may store the correspondence between battery voltage values and charging current values in advance.

As an embodiment, during the process that the power adapter charges the terminal in the second charging mode, it is determined whether there is a poor contact between the first charging interface and the second charging interface by performing the bidirectional communication with the terminal via the first charging interface. When it is determined that there is the poor contact between the first charging interface and the second charging interface, the power adapter is controlled to quit the second charging mode.

As an embodiment, before determining whether there is the poor contact between the first charging interface and the second charging interface, the power adapter receives information indicating a path impedance of the terminal from the terminal. The power adapter sends a fourth instruction to the terminal. The fourth instruction is configured to query a current voltage of the battery in the terminal. The power adapter receives a fourth reply instruction sent by the terminal. The fourth reply instruction is configured to indicate the current voltage of the battery in the terminal. The power adapter determines a path impedance from the power adapter to the battery according to an output voltage of the power adapter and the current voltage of the battery and determines whether there is the poor contact between the first charging interface and the second charging interface according to the path impedance from the power adapter to the battery, the path impedance of the terminal, and a path impedance of a charging wire between the power adapter and the terminal.

As an embodiment, before the power adapter is controlled to quit the second charging mode, a fifth instruction is sent to the terminal. The fifth instruction is configured to indicate that there is the poor contact between the first charging interface and the second charging interface.

After sending the fifth instruction, the power adapter may quit the second charging mode or reset.

The second charging process according to embodiments of the present disclosure is described from the perspective of the power adapter, and then the second charging process according to embodiments of the present disclosure will be described from the perspective of the terminal in the following.

In embodiments of the present disclosure, the terminal supports the first charging mode and the second charging mode. The charging current of the second charging mode is greater than that of the first charging mode. The terminal performs the bidirectional communication with the power adapter via the second charging interface such that the power adapter determines to charge the terminal in the second charging mode. The power adapter outputs according to a charging current corresponding to the second charging mode, for charging the battery in the terminal.

As an embodiment, performing by the terminal the bidirectional communication with the power adapter via the second charging interface such that the power adapter determines to charge the terminal in the second charging mode includes: receiving by the terminal the first instruction sent by the power adapter, in which the first instruction is configured to query the terminal whether to operate in the second charging mode; sending by the terminal a first reply instruction to the power adapter. The first reply instruction is configured to indicate that the terminal agrees to operate in the second charging mode.

As an embodiment, before the terminal receives the first instruction sent by the power adapter, the battery in the terminal is charged by the power adapter in the first charging mode. When the power adapter determines that a charging duration of the first charging mode is greater than a predetermined threshold, the terminal receives the first instruction sent by the power adapter.

As an embodiment, before the power adapter outputs according to the charging current corresponding to the second charging mode for charging the battery in the terminal, the terminal performs the bidirectional communication with the power adapter via the second charging interface, such that the power adapter determines the charging voltage corresponding to the second charging mode.

As an embodiment, performing by the terminal the bidirectional communication with the power adapter via the second charging interface such that the power adapter determines the charging voltage corresponding to the second charging mode includes: receiving by the terminal a second instruction sent by the power adapter, and sending by the terminal a second reply instruction to the power adapter. The second instruction is configured to query whether a current output voltage of the power adapter is suitable for being used as the charging voltage corresponding to the second charging mode. The second reply instruction is configured to indicate that the current output voltage of the power adapter is suitable, high or low.

As an embodiment, before the terminal receives the charging current corresponding to the second charging mode from the power adapter for charging the battery in the terminal, the terminal performs the bidirectional communication with the power adapter via the second charging interface, such that the power adapter determines the charging current corresponding to the second charging mode.

Performing by the terminal the bidirectional communication with the power adapter via the second charging interface such that the power adapter determines the charging current corresponding to the second charging mode includes: receiving by the terminal a third instruction sent by the power adapter, in which the third instruction is configured to query a maximum charging current supported by the terminal; sending by the terminal a third reply instruction to the power adapter, in which the third reply instruction is configured to indicate the maximum charging current supported by the terminal, such that the power adapter determines the charging current corresponding to the second charging mode according to the maximum charging current.

As an embodiment, during a process that the power adapter charges the terminal in the second charging mode, the terminal performs the bidirectional communication with the power adapter via the second charging interface, such that the power adapter continuously adjusts a charging current outputted to the battery.

Performing by the terminal the bidirectional communication with the power adapter via the second charging interface such that the power adapter continuously adjusts a charging current outputted to the battery includes: receiving by the terminal a fourth instruction sent by the power adapter, in which the fourth instruction is configured to query a current voltage of the battery in the terminal; sending by the terminal a fourth reply instruction to the power adapter, in which the fourth reply instruction is configured to indicate the current voltage of the battery in the terminal, such that the power adapter continuously adjusts the charging current outputted to the battery according to the current voltage of the battery.

As an embodiment, during the process that the power adapter charges the terminal in the second charging mode, the terminal performs the bidirectional communication with the control unit, such that the power adapter determines whether there is a poor contact between the first charging interface and the second charging interface.

Performing by the terminal the bidirectional communication with the power adapter, such that the power adapter determines whether there is the poor contact between the first charging interface and the second charging interface includes: receiving by the terminal a fourth instruction sent by the power adapter, in which the fourth instruction is configured to query a current voltage of the battery in the terminal; sending by the terminal a fourth reply instruction to the power adapter, in which the fourth reply instruction is configured to indicate the current voltage of the battery in the terminal, such that the power adapter determines whether there is the poor contact between the first charging interface and the second charging interface according to an output voltage of the power adapter and the current voltage of the battery.

As an embodiment, the terminal receives a fifth instruction sent by the power adapter. The fifth instruction is configured to indicate that there is the poor contact between the first charging interface and the second charging interface.

In order to initiate and adopt the second charging mode, the power adapter may perform a second charging communication procedure with the terminal, for example, by one or more handshakes, so as to realize the second charging of battery. Referring to FIG. 6, the second charging communication procedure according to embodiments of the present disclosure and respective stages in the second charging process will be described in detail. It should be understood that, communication actions or operations illustrated in FIG. 6 are merely exemplary. Other operations or various modifications of respective operations in FIG. 6 can be implemented in embodiments of the present disclosure. In addition, respective stages in FIG. 6 may be executed in an order different from that illustrated in FIG. 6, and it is unnecessary to execute all the operations illustrated in FIG. 6. It should be noted that, a curve in FIG. 6 represents a variation trend of a peak value or a mean value of the charging current, rather than a curve of actual charging current.

In conclusion, with the charging method according to embodiments of the present disclosure, the power adapter is controlled to output the third voltage with the third ripple waveform which meets the charging requirement, and the third voltage with the third ripple waveform outputted by the power adapter is directly applied to the battery of the terminal, thus realizing second charging to the battery directly by the ripple output voltage/current. In contrast to the constant voltage and constant current, a magnitude of the ripple output voltage/current changes periodically, such that a lithium precipitation of the lithium battery may be reduced, the service life of the battery may be improved, and a probability and intensity of arc discharge of a contact of a charging interface may be reduced, the service life of the charging interface may be prolonged, and it is beneficial to reduce polarization effect of the battery, improve charging speed, and decrease heat emitted by the battery, thus ensuring a reliability and safety of the terminal during the charging. Moreover, since the power adapter outputs the voltage with the ripple waveform, it is unnecessary to provide an electrolytic condenser in the power adapter, which not only realizes simplification and miniaturization of the power adapter, but also decreases cost greatly.

In the specification of the present disclosure, it is to be understood that terms such as "central," "longitudinal," "lateral," "length," "width," "thickness," "upper," "lower," "front," "rear," "left," "right," "vertical," "horizontal," "top," "bottom," "inner," "outer," "clockwise," "counterclockwise," "axial," "radial," and "circumference" refer to the orientations and location relations which are the orientations and location relations illustrated in the drawings, and for describing the present disclosure and for describing in simple, and which are not intended to indicate or imply that the device or the elements are disposed to locate at the specific directions or are structured and performed in the specific directions, which could not to be understood to the limitation of the present disclosure.

In addition, terms such as "first" and "second" are used herein for purposes of description and are not intended to indicate or imply relative importance or significance or to imply the number of indicated technical features. Thus, the feature defined with "first" and "second" may comprise one or more of this feature. In the description of the present disclosure, "a plurality of" means two or more than two, unless specified otherwise.

In the present disclosure, unless specified or limited otherwise, the terms "mounted," "connected," "coupled," "fixed" and the like are used broadly, and may be, for example, fixed connections, detachable connections, or integral connections; may also be mechanical or electrical connections; may also be direct connections or indirect connections via intervening structures; may also be inner communications of two elements, which can be understood by those skilled in the art according to specific situations.

In the present disclosure, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on," "above," or "on top of" a second feature may include an embodiment in which the first feature is right or obliquely "on," "above," or "on top of" the second feature, or just means that the first feature is at a height higher than that of the second feature; while a first feature "below," "under," or "on bottom of" a second feature may include an embodiment in which the first feature is right or obliquely "below," "under," or "on bottom of" the second feature, or just means that the first feature is at a height lower than that of the second feature.

Reference throughout this specification to "an embodiment," "some embodiments," "one embodiment", "another example," "an example," "a specific example," or "some examples," means that a particular feature, structure, material, or characteristic described in connection with the embodiment or example is included in at least one embodiment or example of the present disclosure. Thus, the appearances of the phrases such as "in some embodiments," "in one embodiment", "in an embodiment", "in another example," "in an example," "in a specific example," or "in some examples," in various places throughout this specification are not necessarily referring to the same embodiment or example of the present disclosure. Furthermore, the particular features, structures, materials, or characteristics may be combined in any suitable manner in one or more embodiments or examples.

Those skilled in the art may be aware that, in combination with the examples described in the embodiments disclosed in this specification, units and algorithm steps can be implemented by electronic hardware, or a combination of computer software and electronic hardware. In order to clearly illustrate interchangeability of the hardware and software, components and steps of each example are already described in the description according to the function commonalities. Whether the functions are executed by hardware or software depends on particular applications and design constraint conditions of the technical solutions. Persons skilled in the art may use different methods to implement the described functions for each particular application, but it should not be considered that the implementation goes beyond the scope of the present disclosure.

Those skilled in the art may be aware that, with respect to the working process of the system, the device and the unit, reference is made to the part of description of the method embodiment for simple and convenience, which are described herein.

In embodiments of the present disclosure, it should be understood that, the disclosed system, device and method may be implemented in other way. For example, embodiments of the described device are merely exemplary. The partition of units is merely a logical function partitioning. There may be other partitioning ways in practice. For example, several units or components may be integrated into another system, or some features may be ignored or not implemented. Further, the coupling between each other or directly coupling or communication connection may be implemented via some interfaces. The indirect coupling or communication connection may be implemented in an electrical, mechanical or other manner.

In embodiments of the present disclosure, it should be understood that, the units illustrated as separate components can be or not be separated physically, and components described as units can be or not be physical units, i.e., can be located at one place, or can be distributed onto multiple network units. It is possible to select some or all of the units according to actual needs, for realizing the objective of embodiments of the present disclosure.

In addition, each functional unit in the present disclosure may be integrated in one progressing module, or each functional unit exists as an independent unit, or two or more functional units may be integrated in one module.

If the integrated module is embodied in software and sold or used as an independent product, it can be stored in the computer readable storage medium. Based on this, the technical solution of the present disclosure or a part making a contribution to the related art or a part of the technical solution may be embodied in a manner of software product. The computer software produce is stored in a storage medium, including some instructions for causing one computer device (such as a personal PC, a server, or a network device etc.) to execute all or some of steps of the method according to embodiments of the present disclosure. The above-mentioned storage medium may be a medium able to store program codes, such as, USB flash disk, mobile hard disk drive (mobile HDD), read-only memory (ROM), random-access memory (RAM), a magnetic tape, a floppy disc, an optical data storage device, and the like.

Although explanatory embodiments have been illustrated and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. A charging system, comprising:
   a battery;
   a first rectifier, configured to rectify an input alternating current and output a first voltage with a first ripple waveform;
   a switch unit, configured to modulate the first voltage according to a control signal and output a modulated first voltage;
   a transformer, configured to output a second voltage with a second ripple waveform according to the modulated first voltage;
   a second rectifier, configured to rectify the second voltage to output a third voltage with a third ripple waveform;
   a sampling unit, configured to sample current outputted by the second rectifier to obtain a current sampling value; and
   a control unit, coupled to the sampling unit and the switch unit respectively, and configured to output the control signal to the switch unit, and to control a charging process to be in a constant current charging stage by adjusting a duty ratio of the control signal when it is determined that current outputted is high or low according to the current sampling value wherein the third voltage is applied to the battery.

2. The charging system according to claim 1, further comprising a terminal, wherein the battery is a component in the terminal.

3. A power adapter, comprising:
   a first rectifier, configured to rectify an input alternating current and output a first voltage with a first ripple waveform;
   a switch unit, configured to modulate the first voltage according to a control signal and output a modulated first voltage;
   a transformer, configured to output a second voltage with a second ripple waveform according to the modulated first voltage;
   a second rectifier, configured to rectify the second voltage to output a third voltage with a third ripple waveform, wherein the third voltage is configured to be introduced into a terminal to charge a battery in the terminal when the power adapter is coupled to the terminal;
   a sampling unit, configured to sample current outputted by the second rectifier to obtain a current sampling value; and
   a control unit, coupled to the sampling unit and the switch unit respectively, and configured to output the control signal to the switch unit, and to control a charging process performed by the power adapter on a terminal to be in a constant current charging stage by adjusting a duty ratio of the control signal when it is determined that current outputted by the power adapter is high or low according to the current sampling value.

4. The power adapter according to claim 3, wherein the control unit is configured to reduce the duty ratio of the control signal when the current outputted by the power adapter is high, and to increase the duty ratio of the control signal when the current outputted by the power adapter is low.

5. The power adapter according to claim 3, wherein the sampling unit is further configured to sample voltage outputted by the second rectifier to obtain a voltage sampling value.

6. The power adapter according to claim 5, wherein after the constant current charging stage is completed, the control unit is further configured to control the charging process performed by the power adapter on the terminal to be in a constant voltage charging stage by adjusting the duty ratio of the control signal when it is determined that voltage outputted by the power adapter is high or low according to the voltage sampling value.

7. The power adapter according to claim 6, wherein the control unit is configured to reduce the duty ratio of the control signal when the voltage outputted by the power adapter is high, and to increase the duty ratio of the control signal when the voltage outputted by the power adapter is low.

8. The power adapter according to claim 5, wherein the sampling unit comprises:
   a first current sampling circuit, configured to sample the current outputted by the second rectifier so as to obtain the current sampling value; and
   a first voltage sampling circuit, configured to sample the voltage outputted by the second rectifier so as to obtain the voltage sampling value.

9. The power adapter according to claim 8, wherein the first voltage sampling circuit comprises:
   a peak voltage sampling and holding unit, configured to sample and hold a peak voltage of the third voltage;
   a cross-zero sampling unit, configured to sample a zero crossing point of the third voltage;
   a leakage unit, configured to perform a leakage on the peak voltage sampling and holding unit at the zero crossing point; and
   an analog-digital (AD) sampling unit, configured to sample the peak voltage in the peak voltage sampling and holding unit so as to obtain the voltage sampling value.

10. The power adapter according to claim 3, wherein
    the power adapter comprises a first charging interface,
    the first charging interface comprises: a power wire, configured to charge the battery; and a data wire, configured to communicate with the terminal when the power adapter is coupled to the terminal via the first charging interface.

11. The power adapter according to claim 10, wherein the control unit is configured to communicate with the terminal via the first charging interface to determine a charging mode, in which the charging mode comprises a second charging mode and a first charging mode, and the second charging mode is different from the first charging mode.

12. The power adapter according to claim 11, wherein when the control unit performs the bidirectional communication with the terminal via the data wire of the first charging interface to determine to charge the terminal in the second charging mode, the control unit is configured to send a first instruction to the terminal, in which the first instruction is configured to query the terminal whether to operate in the second charging mode; and the control unit is configured to receive a first reply instruction from the terminal, in which the first reply instruction is configured to indicate that the terminal agrees to operate in the second charging mode.

13. The power adapter according to claim 12, wherein, the control unit is configured to send the first instruction to the terminal when it is determined that a charging duration of the first charging mode is greater than a predetermined threshold.

14. The power adapter according to claim 12, wherein the control unit is further configured to control the power adapter to adjust a charging current to a charging current corresponding to the second charging mode by controlling the switch unit, and before the power adapter charges the terminal with the charging current corresponding to the second charging mode, the control unit is configured to perform the bidirectional communication with the terminal via the data wire of the first charging interface to determine a charging voltage corresponding to the second charging mode, and to control the power adapter to adjust a charging voltage to the charging voltage corresponding to the second charging mode.

15. The power adapter according to claim 14, wherein when the control unit performs the bidirectional communication with the terminal via the data wire of the first charging interface to determine the charging voltage corresponding to the second charging mode, the control unit is configured to send a second instruction to the terminal, in which the second instruction is configured to query whether a current output voltage of the power adapter is suitable for being used as the charging voltage corresponding to the second charging mode;

the control unit is configured to receive a second reply instruction sent from the terminal, in which the second reply instruction is configured to indicate that the current output voltage of the power adapter is suitable, high or low; and the control unit is configured to determine the charging voltage corresponding to the second charging mode according to the second reply instruction.

16. The power adapter according to claim 14, wherein, before controlling the power adapter to adjust the charging current to the charging current corresponding to the second charging mode, the control unit is further configured to perform the bidirectional communication with the terminal via the data wire of the first charging interface to determine the charging current corresponding to the second charging mode.

17. The power adapter according to claim 16, wherein, when the control unit performs the bidirectional communication with the terminal via the data wire of the first charging interface to determines the charging current corresponding to the second charging mode, the control unit is configured to send a third instruction to the terminal, in which the third terminal is configured to query a maximum charging current supported by the terminal;

the control unit is configured to receive a third reply instruction sent from the terminal, in which the third reply instruction is configured to indicate the maximum charging current supported by the terminal; and the control unit is configured to determine the charging current corresponding to the second charging mode according to the third reply instruction.

18. A charging method, comprising:

performing a first rectification on a first alternating current to output a first voltage with a first ripple waveform;

modulating the first voltage by controlling a switch unit, and outputting a second voltage with a second ripple waveform by a conversion of a transformer;

performing a second rectification on the second voltage to output a third voltage with a third ripple waveform, and applying the third voltage to a battery of the terminal;

sampling current after the second rectification to obtain a current sampling value; and controlling a charging process to be in a constant current charging stage by adjusting a duty ratio of a control signal for controlling the switch unit when it is determined that current outputted is high or low according to the current sampling value.

19. The charging method according to claim 18, wherein adjusting a duty ratio of a control signal comprises:

reducing the duty ratio of the control signal when the current outputted is high; and increasing the duty ratio of the control signal when the current outputted is low.

20. The charging method according to claim 18, further comprising:

communicating with a terminal so as to determine a charging mode, in which the charging mode comprises a second charging mode and a first charging mode, and the second charging mode is different from the first charging mode.

* * * * *